(12) United States Patent
Shibata et al.

(10) Patent No.: US 6,600,676 B2
(45) Date of Patent: Jul. 29, 2003

(54) NONVOLATILE SEMICONDUCTOR MEMORY DEVICE WITH A ROM BLOCK SETTABLE IN THE WRITE OR ERASE INHIBIT MODE

(75) Inventors: Noboru Shibata, Yokohama (JP); Tomoharu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 09/957,019

(22) Filed: Sep. 21, 2001

(65) Prior Publication Data

US 2002/0036930 A1 Mar. 28, 2002

(30) Foreign Application Priority Data

Sep. 28, 2000 (JP) .......................................... 2000-297443

(51) Int. Cl.$^7$ .............................................. G11C 16/22
(52) U.S. Cl. ........................... 365/185.04; 365/185.03; 365/185.11; 365/185.12; 365/185.09; 365/185.29
(58) Field of Search ........................ 365/185.03, 185.04, 365/185.09, 185.12, 185.11, 185.17, 185.22, 185.33, 185.29

(56) References Cited

U.S. PATENT DOCUMENTS

| 5,363,334 A | | 11/1994 | Alexander et al. |
| 5,590,086 A | * | 12/1996 | Park et al. ............. 365/230.03 |
| 5,631,871 A | * | 5/1997 | Park et al. .................. 365/203 |

* cited by examiner

*Primary Examiner*—Andrew Q. Tran
(74) *Attorney, Agent, or Firm*—Banner & Witcoff, Ltd.

(57) ABSTRACT

A memory cell array has a first and a second storage area. The first storage area has a plurality of memory elements selected by an address signal. The second storage area has a plurality of memory elements selected by a control signal. A control circuit has a fuse element. When the fuse element has been blown, the control circuit inhibits at least one of writing and erasing from being done on the second storage area.

23 Claims, 43 Drawing Sheets

FIG. 6A — 1-G (quadrual) BLOCK SIZE 32-KB MODE

| IO | 0 | 1 | 2 | 3 | 4 | 5 | 6 | 7 |
|---|---|---|---|---|---|---|---|---|
| First cycle | A0 | A1 | A2 | A3 | A4 | A5 | A6 | A7 | A8 |
| Second cycle | A9 | A10 | A11 | A12 | A13 | A14 | A15 | A16 | A8E |
| | ML Add. | BitLineAdd. | | NAND Address | | | PysicalBlockAdd. | |
| Third cycle | A17 | A18 | A19 | A20 | A21 | A22 | A23 | A24 |
| | | | | Block Address | | | | |
| Fourth cycle | A25 | A26 | A27 | A28 | A29 | | | |
| | BlockAdd. | | MultiChipAddress | | | | | |

(Column Address spans first and second cycles for A0–A8)

FIG. 6B — 512-M (binary) BLOCK SIZE 16-KB MODE

| IO | 0 | 1 | 2 | 3 | 4 | 5 | 6 | 7 |
|---|---|---|---|---|---|---|---|---|
| First cycle | | | | Column Address | | | | |
| Second cycle | BitLineAdd. | | NAND Address | | | PysicalBlockAdd. | Block Add. |
| Third cycle | | | | Block Address | | | | |
| Fourth cycle | BlockAdd. | | MultiChipAddress | | | | | |

FIG. 6C — 1-G (quadrual) BLOCK SIZE 128-KB MODE

| IO | 0 | 1 | 2 | 3 | 4 | 5 | 6 | 7 |
|---|---|---|---|---|---|---|---|---|
| First cycle | | | | Column Address | | | | |
| Second cycle | PysicalBlockAdd. | ML Add. | BitLineAdd. | NAND Address | | | | |
| Third cycle | | | | Block Address | | | | |
| Fourth cycle | BlockAdd. | | MultiChipAddress | | | | | |

FIG. 6D — 512-M (binary) BLOCK SIZE 64-KB MODE

| IO | 0 | 1 | 2 | 3 | 4 | 5 | 6 | 7 |
|---|---|---|---|---|---|---|---|---|
| First cycle | | | | Column Address | | | | |
| Second cycle | PysicalBlockAdd. | BitLineAdd. | | NAND Address | | | Block Add. |
| Third cycle | | | | Block Address | | | | |
| Fourth cycle | BlockAdd. | | MultiChipAddress | | | | | |

| | | | | | |
|---|---|---|---|---|---|
| A0 | L | H | L | ~ | H |
| A1 | L | L | H | ~ | H |
| A2 | L | L | L | ~ | H |
| CA | 0 | 1 | 2 | ~ | 7 |
| A3 | L | H | L | ~ | H |
| A4 | L | L | H | ~ | H |
| A5 | L | L | L | ~ | H |
| CB | 0 | 1 | 2 | ~ | 7 |
| A6 | L | H | L | ~ | H | — |
| A7 | L | L | H | ~ | H | — |
| A8 | L | L | L | ~ | H | — |
| A8E | L | L | L | ~ | H | H |
| CC | 0 | 1 | 2 | ~ | 7 | 8 |

FIG. 7A

| | Body area | | | | ECC code area | | | | ECC code or R/D | | | | R/D area | | | |
|---|---|---|---|---|---|---|---|---|---|---|---|---|---|---|---|---|
| | 528 columns | | | | 17 columns | | | | 4 columns | | | | 4 columns | | | |
| CA | 0 | 1 | 6 | 7 | 0 | 1 | 7 | 0 | | | | | | | | |
| CB | 0 | 0 | ~ | 1 | 1 | 2 | 2 | ~ | 3 | 4 | | | | | | |
| CC | 0 | 0 | | 8 | 8 | 8 | 8 | | 8 | 8 | | | | | | |
| CSS | | | | | | | | | | | | | 4 | 5 | 6 | 7 | 0 | 1 | 2 | 3 |
| CSL | 0 | 1 | ~ | 525 | 527 | 528 | 529 | ~ | 543 | 544 | | | | | | |
| A0 | L | H | | L | H | L | H | | H | L | H | L | H | L |
| A1 | L | L | | H | H | L | L | | H | L | L | H | H | L |
| A2 | L | L | | H | H | L | L | | H | L | L | L | L | H |
| A3 | L | L | | H | H | L | L | | H | L | L | L | L | L |
| A4 | L | L | ~ | L | L | H | H | ~ | H | L | L | L | L | L |
| A5 | L | L | | L | L | L | L | | L | H | H | H | H | H |
| A6 | L | L | | L | L | L | L | | L | L | L | L | L | L |
| A7 | L | L | | L | L | L | L | | L | L | L | L | L | L |
| A8 | L | L | | L | L | L | L | | L | L | L | L | L | L |
| A8E | L | L | | H | H | H | H | | H | H | H | H | H | H |

FIG. 7B

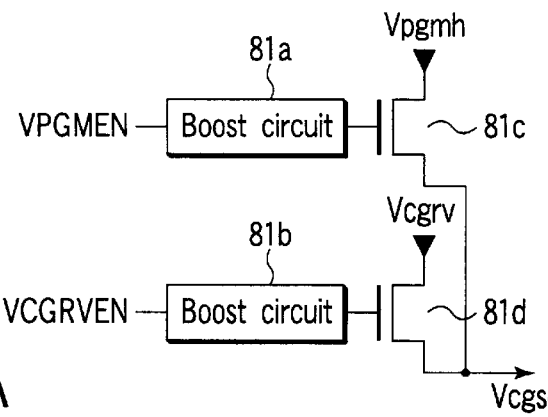
FIG. 8A
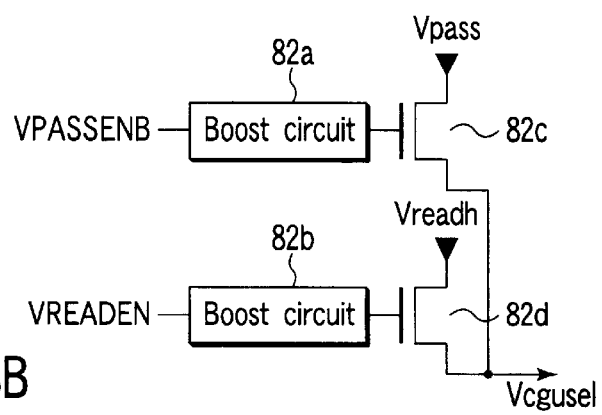
FIG. 8B
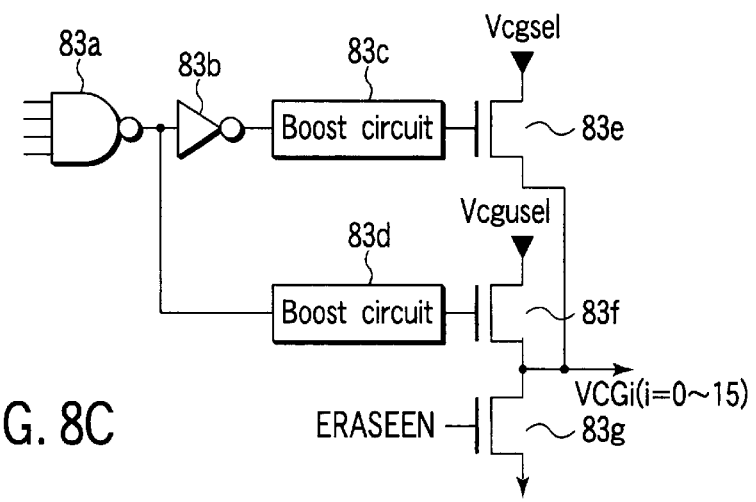
FIG. 8C
FIG. 8D

| Array | 0 | 1 | 2 | 3 |
|---|---|---|---|---|
| A15 | L | H | L | H |
| A16 | L | L | H | H |
| PBLATPB | 0 | 1 | 2 | 3 |
FIG. 9A
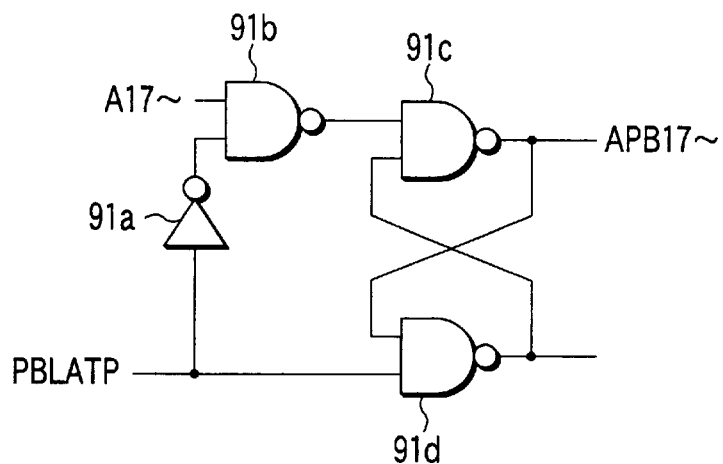
FIG. 9B
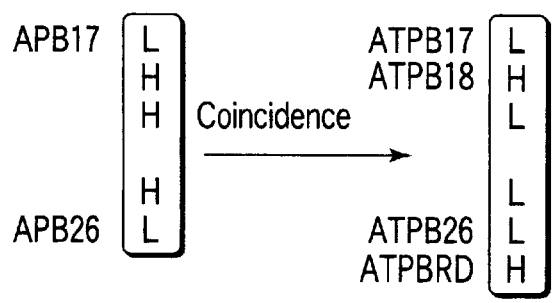
FIG. 10

| ATPB17 | L | H | L | H |
|---|---|---|---|---|
| ATPB19 | L | L | H | H |
| AROWA | 0 | 1 | 2 | 3 |
| ATPB18 | L | H | | |
| RDECPB | L | R | | |
| ATPB20 | L | H | L | H |
| ATPB21 | L | L | H | H |
| AROWB | 0 | 1 | 2 | 3 |
| ATPB22 | L | H | L | H |
| ATPB23 | L | L | H | H |
| AROWC | 0 | 1 | 2 | 3 |
| ATPB24 | L | H | L | H |
| ATPB25 | L | L | H | H |
| AROWD | 0 | 1 | 2 | 3 |
| ATPB26 | L | H | L | |
| ATPBRD | L | L | H | |
| AROWE | 0 | 1 | 2 | |

FIG. 11

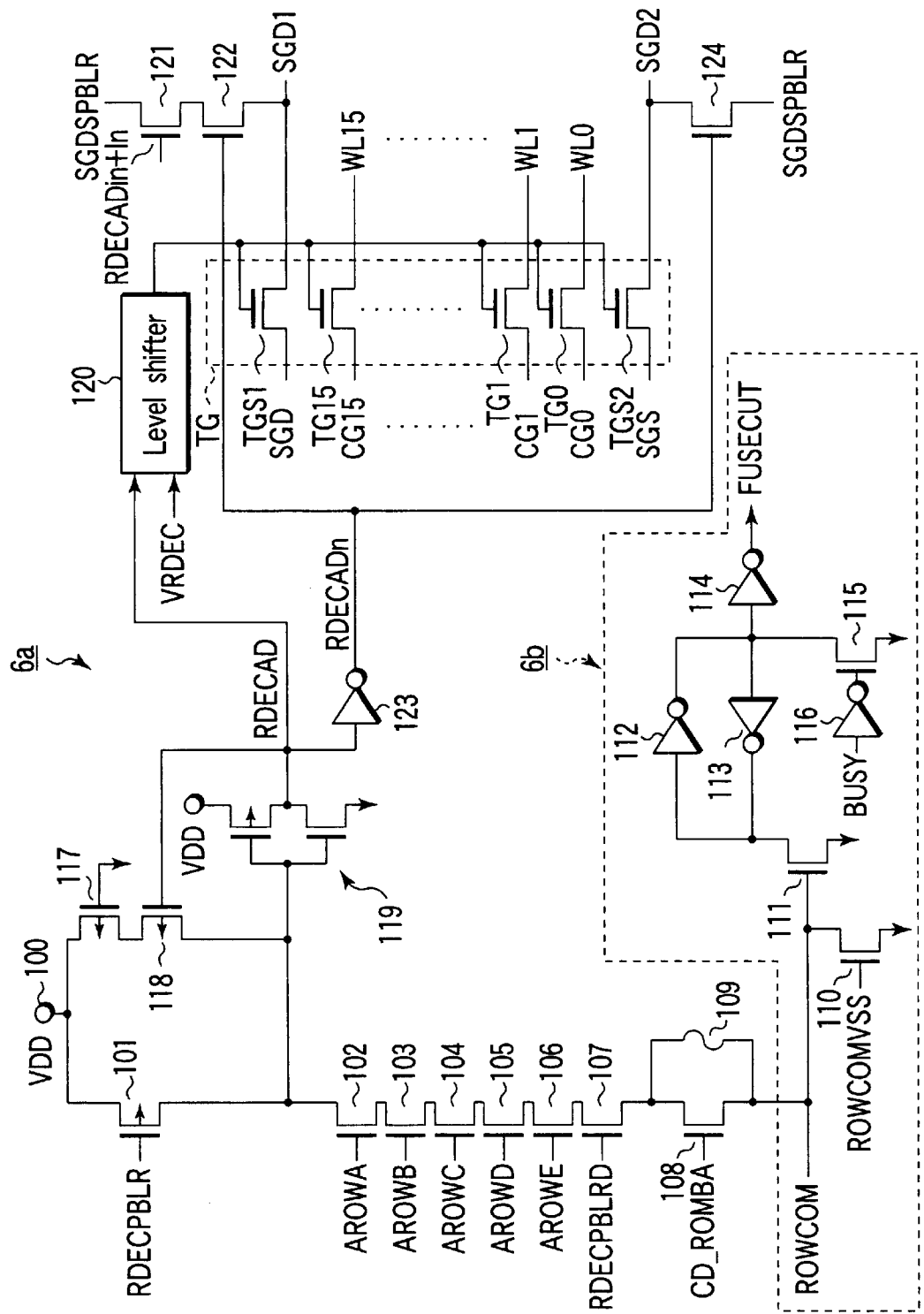
F I G. 12

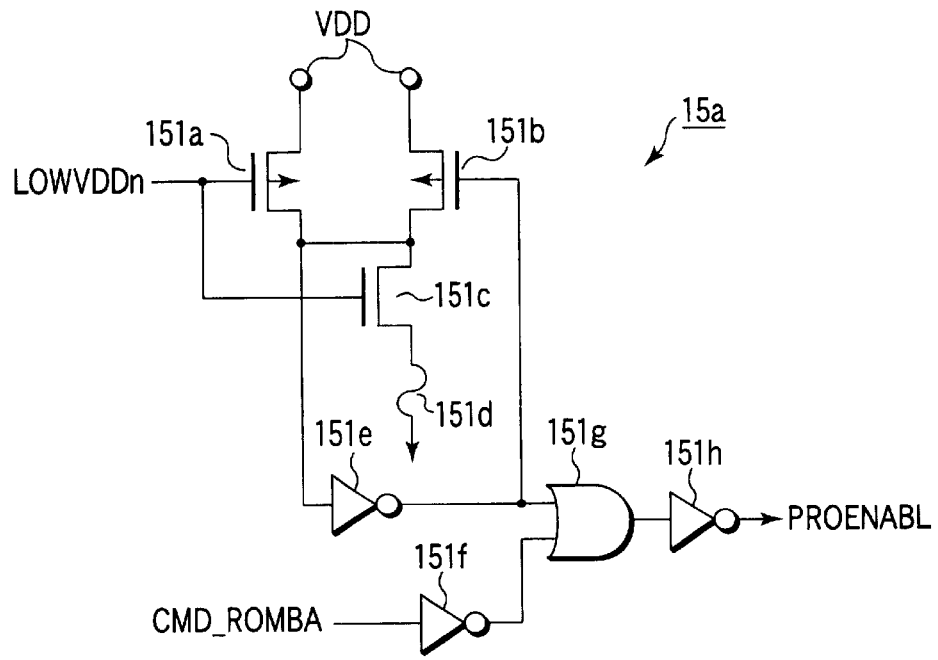
F I G. 15A
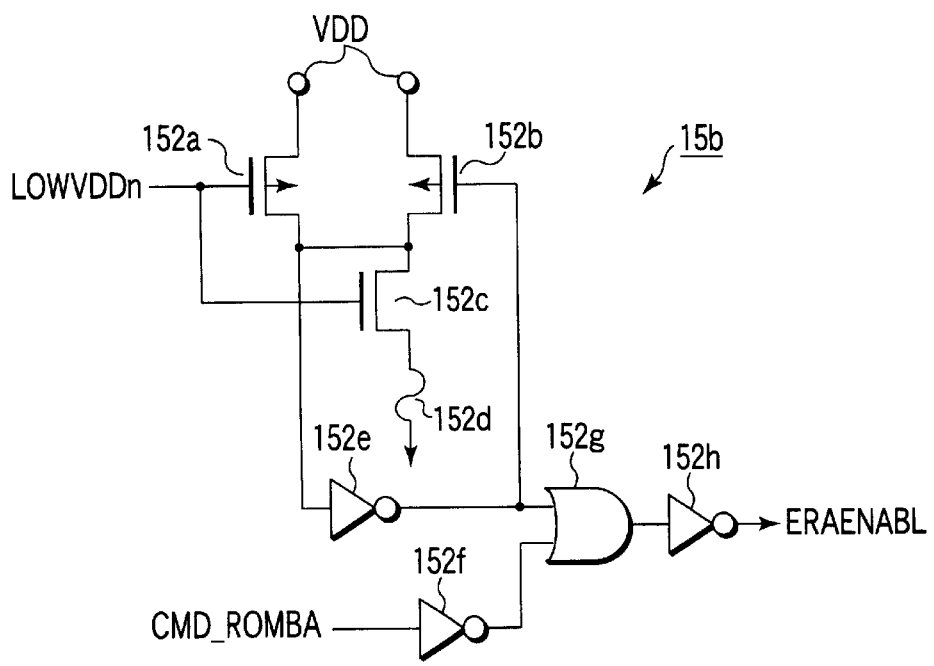
F I G. 15B

FIG. 17A

| Data in memory cell | Threshold voltage of memory cell | Data to be written and read | |
|---|---|---|---|
| | | First page | Second page |
| 0 | 0V or less | 1 | 1 |
| 1 | 0.3V~0.5V | 0 | 1 |
| 2 | 0.8V~1.0V | 0 | 0 |
| 3 | 1.3V~1.5V | 1 | 0 |

Data in memory cell and threshold voltage of memory cell

FIG. 17B

| | Number of necessary step-ups | Number of writes |
|---|---|---|
| First-page writing | 13 | (0→1) 13 times |
| Second-page writing | 11 | (0→3) 11 times  (1→2) 6 times |
| Total | 24 | |

FIG. 17C

| | Number of necessary step-ups | Number of writes |
|---|---|---|
| First-page and second-page simultaneous writing | 20 | (0→1) 13 times  (0→2) 17 times  (0→3) 20 times |
| Total | 20 | |

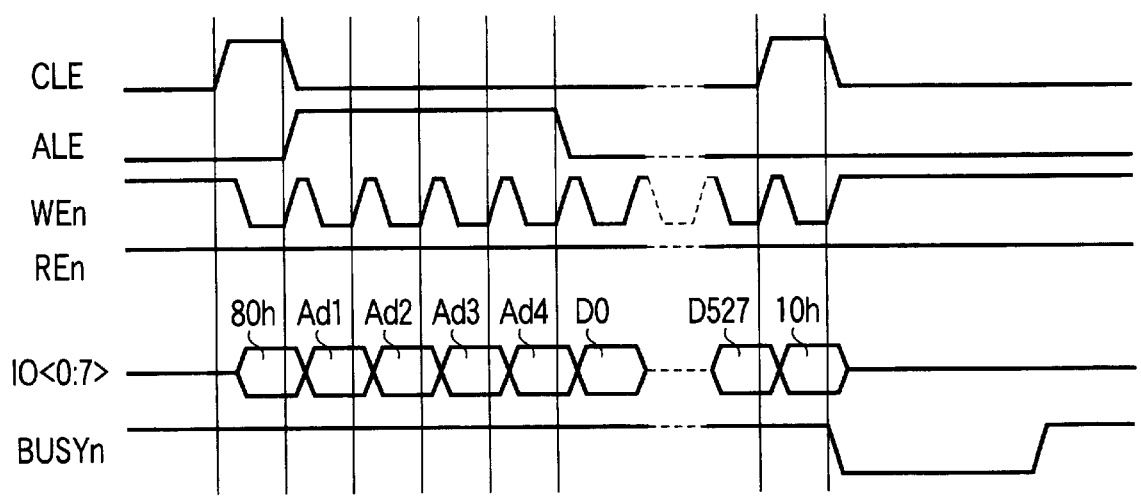
F I G. 19

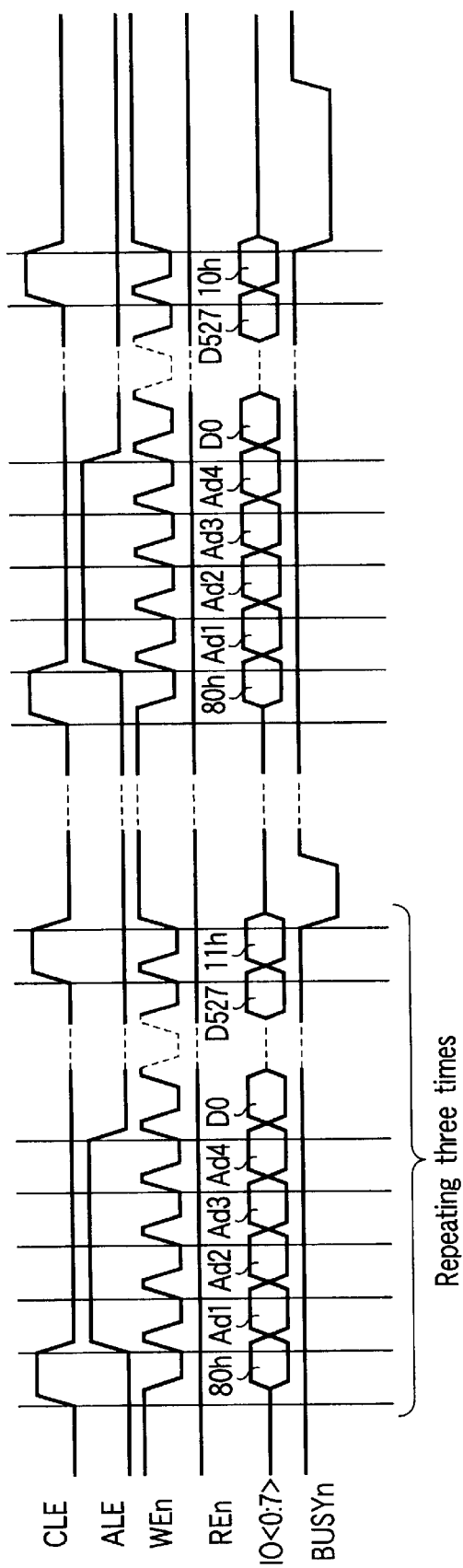
F I G. 20

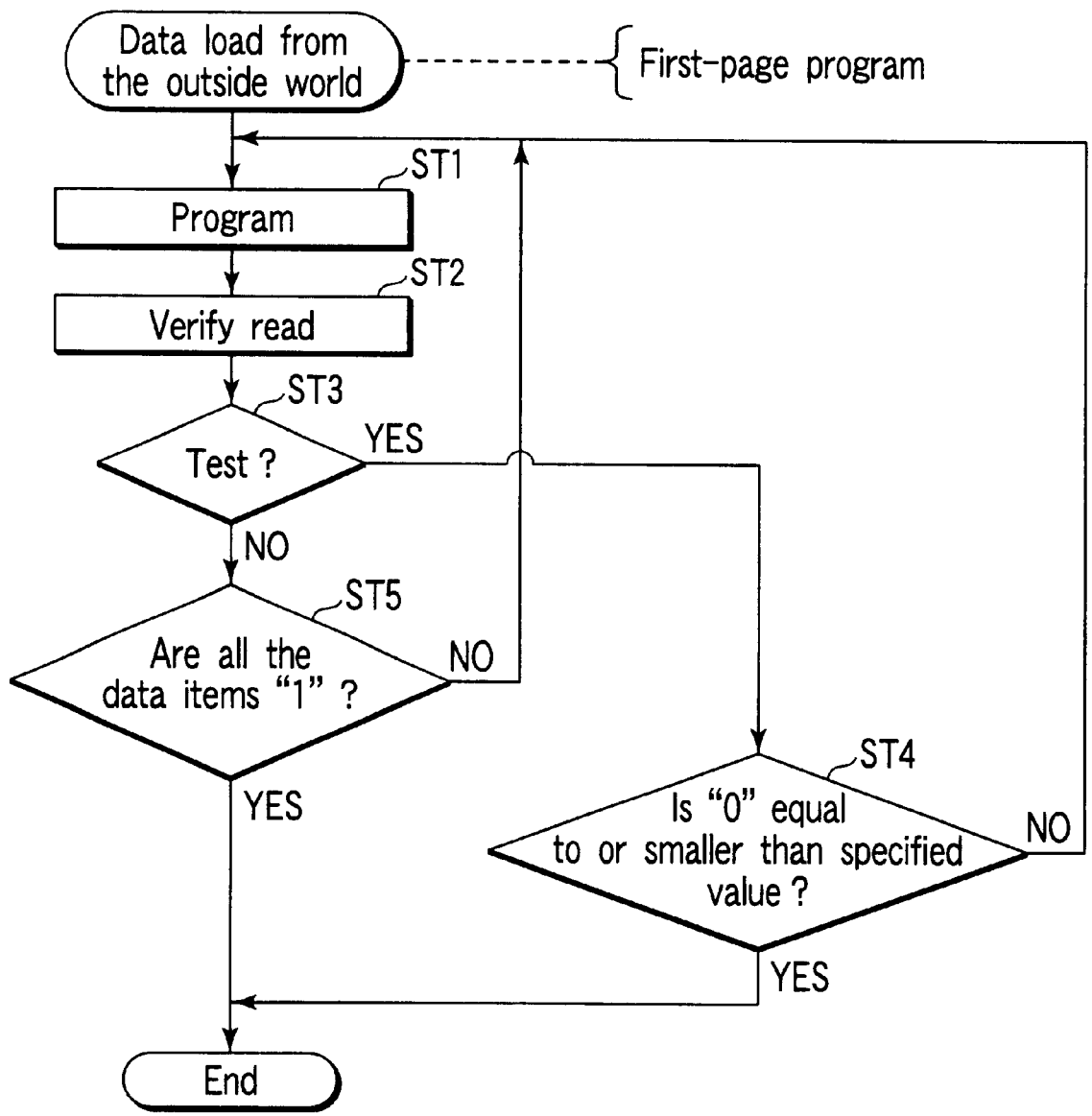
F I G. 21

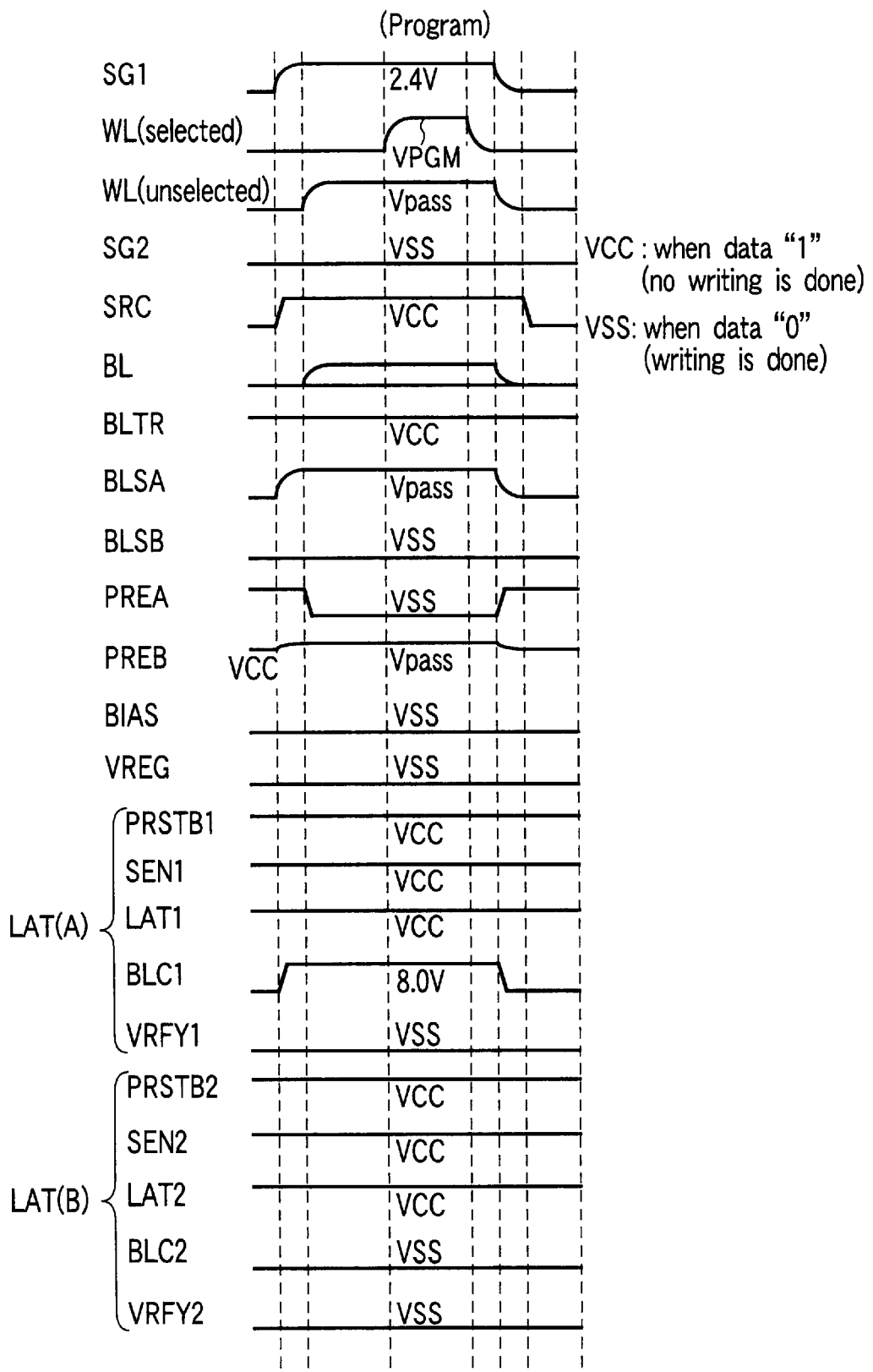
F I G. 23

Program verify (first page)

| State 0 | State 0→1 | | Data in memory cell |
|---|---|---|---|
| inhibit | Write (OK) | Write (NG) | |
| A B bit | A B bit | A B bit | |
| H L | L L | L | Data load (write→L, inhibit→H in A) |
| H H | L H | L L | Read at b' |
| H H | L H | L L | Bit line is H when A is H (VRFY1) |
| H H | H H | L L | Potential of bit line is latched in A |
| | | 0→1 | Verify |

(inhibit = no writing, A = LAT(A), B = LAT(B))

FIG. 24

Program verify (second-page)

FIG. 26A

| | State 0 | | | | State 1 | | | State 1→2 | | | | Data in memory cell | |
|---|---|---|---|---|---|---|---|---|---|---|---|---|---|
| inhibit | Write (OK) | | Write (NG) | | inhibit | | | Write (OK) | | Write (NG) | | | |
| A B bit | A B bit NS bit | | A B bit NS bit | | A B bit NS bit | | | A B bit NS bit | | A B bit NS bit | | | |
| H H | L | | | | H | | | L | | | | | |
| H L | H L | | L | | H L | | | H L | L | | | | |
| L H L | H H L | | L L L | | H H H | | | L L L | L L L | | | Data load (write→L, inhibit→H in A) Save A onto unselected bit line | Outer data load |
| L L L | H H L | | L L L | | H L H | | | L L L | L L L | | | | |
| L H H | H L L | | L L L | | H L L | | | L H L | L L L | | | Read at a' Load potential of bit lien into A Reset B to H When A is H, change B from H→L Return potential of unselected bit line to A | Inner data load |
| L L H | H H H | | L L L | | H L H | | | L L L | L L L | | | | |
| H L H | H H L | | L L L | | H L L | | | H L L | L L L | | | | |
| H H L | H H H | | L L L | | H L H | | | H L L | L L L | | | | |

FIG. 26B

| H H | L H | L L | L L | Read at b' When B is H, bit line is L (VRFY2) When A is H, bit line is H (VRFY1) Load potential of bit line into A | 1→2 Verify |
|---|---|---|---|---|---|
| H H L | L H L/H | L L L | L L L | | |
| H H H | L H L | L L L | L L L | | |
| H H H | L H L | L L L | L L L | | |
| H L H | L H L | H L L | L L L | | |

FIG. 26C

| H H | L H | L L | L L | Read at c' When A is H, bit line is H (VRFY1) Load potential of bit line into A | 0→3 Verify |
|---|---|---|---|---|---|
| H H L | L H L | L H L | L L L | | |
| H H H | L H L | L H L | L L L | | |
| H H H | L H L | L H L | L L L | | |
| H L H | H H L | L H L | L L L | | |

(inhibit=no writing, Nsbit=unselected bit line, A=LAT(A), B=LAT(B))

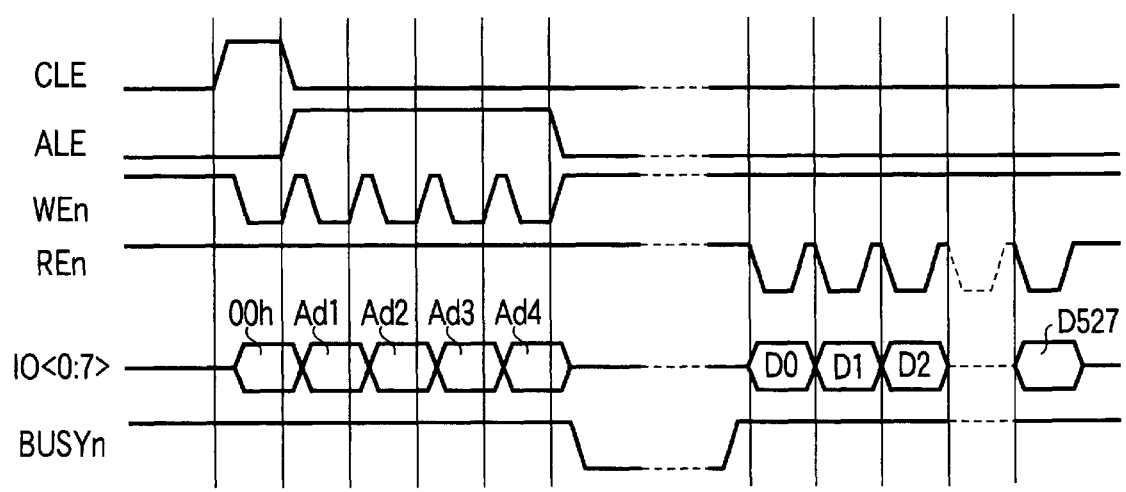
F I G. 29

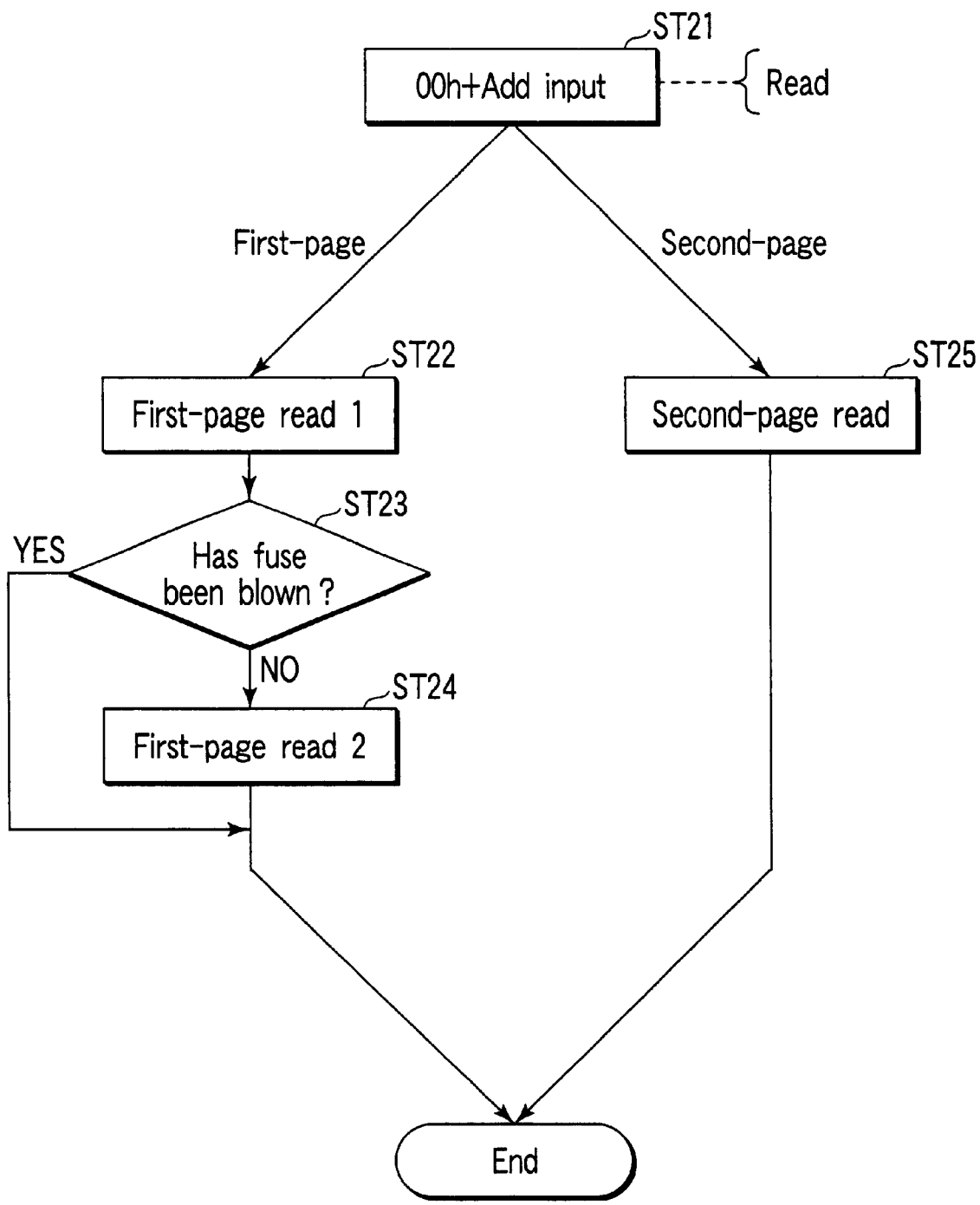
F I G. 31

Read (second page)

| State 0,1 | | State 2,3 | | | |
|---|---|---|---|---|---|
| A B bit | | A B bit | | | |
| L | | H | | Read at b | Second-page read |
| L | L | H | H | Latch potential of bit line in A | |

(A=LAT(A), B=LAT(B))

FIG. 32

Read (first page)

| State 0 | | State 1,2 | | State 3 | | | |
|---|---|---|---|---|---|---|---|
| A B bit | | A B bit | | A B bit | | | |
| L | | L | | H | | Read at c | First read |
| L | L | L | L | H | H | Latch potential of bit line in LAT(A) | |

FIG. 33A

| L | L | L | H | | H | Read at a | Second read |
|---|---|---|---|---|---|---|---|
| L | L | L | H | H | L | When LAT(A) is H, bit line is L (VRFY1) | |
| L | L | H | H | L | L | Latch potential of bit line in A | |

FIG. 33B (A=LAT(A), B=LAT(B))

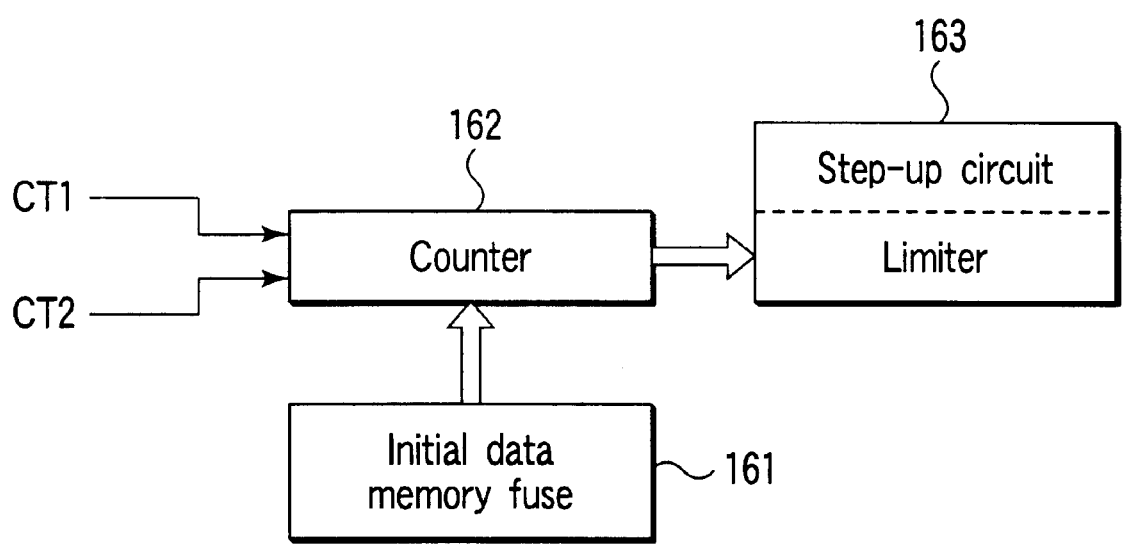
F I G. 41

Program verify (first-page and second-page simultaneous)

| State 0 | State 0→1 | | State 0→2 | | State 0→3 | | Data in memory cell |
|---|---|---|---|---|---|---|---|
| inhibit | Write (OK) | Write (NG) | Write (OK) | Write (NG) | Write (OK) | Write (NG) | |
| A B C bit NS bit | A B C bit NS bit | A B C bit NS bit | A B C bit NS bit | A B C bit NS bit | A B C bit NS bit | A B C bit NS bit | |
| H | L | | L | | H | | Data load (write→L, inhibit→H in A) |
| H H | L H | | L H | | H H | | Reset B to H |
| H L | L H | | L H | | H L | | When A is H, set B from H→L |

(inhibit=no writing, Nsbit=unselected bit, A=LAT(A), B=LAT(B), C=LAT(C))

FIG. 44

Program verify (first-page and second-page simultaneous)

| | State 0 | State 0→1 | | State 0→2 | | State 0→3 | | Data in memory cell |
|---|---|---|---|---|---|---|---|---|
| | inhibit | Write (OK) | Write (NG) | Write (OK) | Write (NG) | Write (OK) | Write (NG) | |
| | A B C bit NS bit | A B C bit NS bit | A B C bit NS bit | A B C bit NS bit | A B C bit NS bit | A B C bit NS bit | A B C bit NS bit | |
| | H L | H H | | L H | | L L | | Data load (write→L, inhibit→H in A) |
| | H L H | H H H | | L H L | | L L L | | Save A in selected/unselected bit line |
| | H L H H | H H H H | | L H H L | | L L H L | | Reset C to H |
| | H L H H L | H H H H L | | L H H H L | | L L H H L | | When A is H, change C from H→L |
| | H L H H L | H H H H L | | L H H H L | | L L H H L | | When B is H, set selected bit line to H |
| | H L H H L | H H H H L | | L H H H L | | L L H H L | | When B is H, set unselected bit line to L |
| | H L H H L | H H H H L | | H H H H L | | L L H H L | | Read selected bit line to A |
| | H L H H L | H H L H L | | H L H H L | | L L H H L | | Reset B to H |
| | H L H H L | H L L L H L(?)| | L L H H L | | L L H H L | | When A is H, change B from H→L |
| | | | | | | L L H H L | | Read unselected bit to A |
| | H L L L | L L L L | (L)L L L | L L H L | (L)L H L | L H H L | L H H L | Read at a' |
| | H L L L | L L L L | (L)L L L | L L H L | (L)L H L | L H H L | L H H L | When C is H, bit line is L (VRFY2) |
| | H L L H | L L L L | (L)L L L | L L H L | (L)L H L | L H H L | L H H L | When A is H, bit line is H (VRFY1) |
| | H L L H | H L L L | (L)L L L | L L H L | (L)L H L | L H H L | L H H L | Load potential of bit line into A |
| | H L L L | L L L L | | L L H H | (L)L H H | L H H H | (L)L H H | Read at b' |
| | H L L L | L L L L | | L L H H | (L)L H H | L H H H | (L)L H H | When B is H, bit line is L (VRFY2) |
| | H L L H | L L L L | | L L H H | (L)L H H | L H H H | (L)L H H | When A is H, bit line is H (VRFY1) |
| | H L L H | L L L L | | H L H H | (L)L H H | L H H H | (L)L H H | Load potential of bit line into A |
| | H L L L | L L L L | | L L H L | | L H H L | L H H L | Read at c' |
| | H L L L | L L L L | | L L H L | | L H H L | L H H L | When A is H, bit line is H (VRFY1) |
| | H L L H | L L L L | | L L H L | | H H H H | L H H L | Load potential of bit line into A |

FIG. 45A / FIG. 45B / FIG. 45C / FIG. 45D (inhibit=no writing, Nsbit=unselected bit, A=LAT(A), B=LAT(B), C=LAT(C))

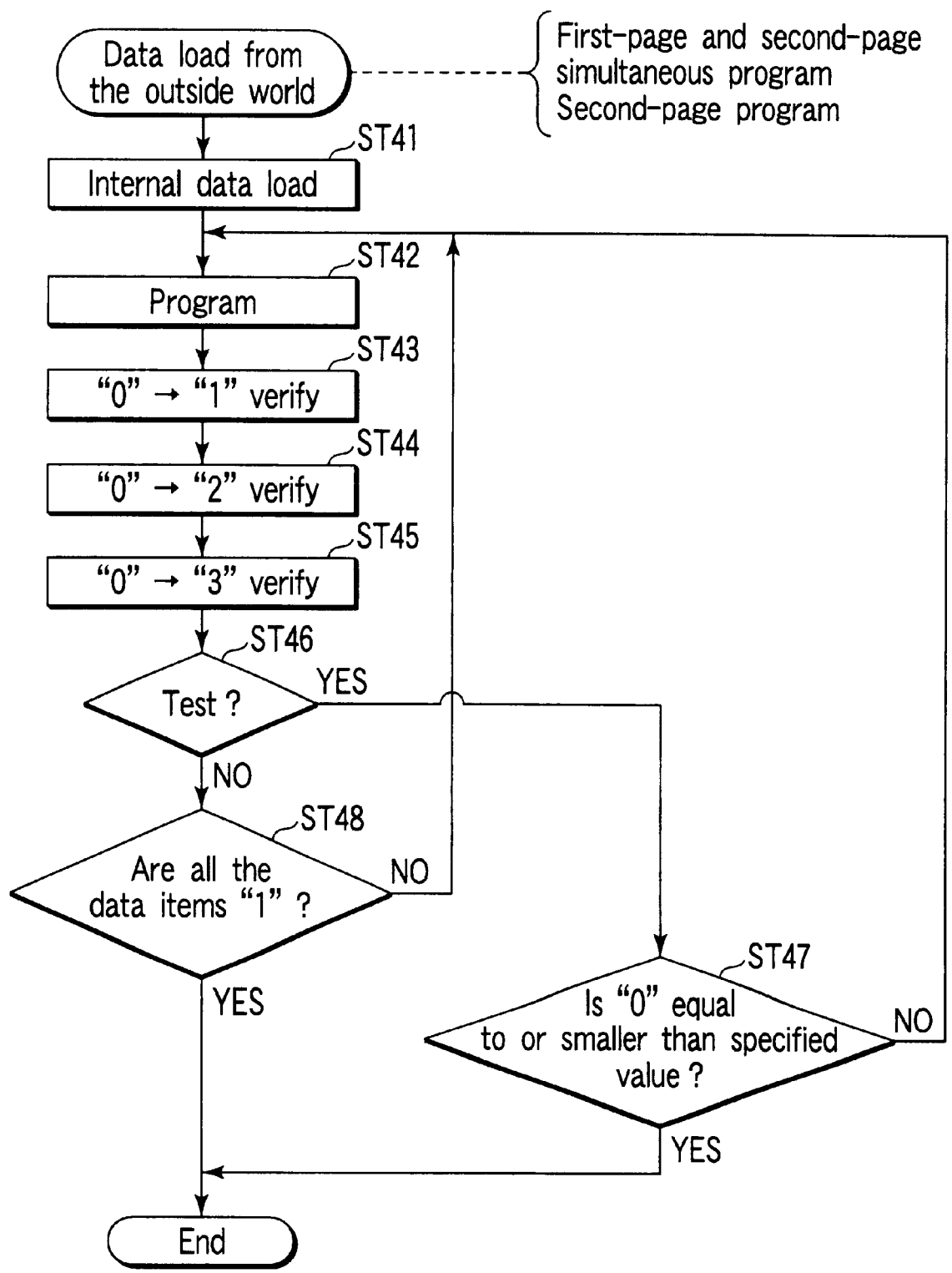
F I G. 46

NONVOLATILE SEMICONDUCTOR MEMORY DEVICE WITH A ROM BLOCK SETTABLE IN THE WRITE OR ERASE INHIBIT MODE

CROSS-REFERENCE TO RELATED APPLICATIONS

This application is based upon and claims the benefit of priority from the prior Japanese Patent Application No. 2000-297443, filed Sep. 28, 2000, the entire contents of which are incorporated herein by reference.

BACKGROUND OF THE INVENTION

1. Field of the Invention

This invention relates to a semiconductor memory device, and more particularly to an electrically rewritable nonvolatile semiconductor memory device.

2. Description of the Related Art

A NAND flash memory using an EEPROM as an electrically rewritable nonvolatile semiconductor memory device has been proposed. In the NAND flash memory, the sources and drains of a plurality of memory cells arranged side by side are connected in series with one another. The plurality of memory cells connected in series are treated as a unit and connected to a bit line. In the NAND flash memory, the data is written into or read from all or half of the cells arranged in the direction of a row at the same time. In recent years, a multivalued memory that enables a plurality of data items to be stored in a cell of the NAND flash memory has been developed.

This type of nonvolatile semiconductor memory device has a memory element area called a ROM block (ROMBLOCK) in which a recognition code or the like for security is stored. The ROM block, which is selected by a special command, is allocated to a part of the redundant cells for remedying faulty cells in the memory cell array. Consequently, when a part of the redundant cells are at fault, this causes a problem: the ROM block cannot be used.

In addition, since the ROM block uses a part of the redundant cells, it is difficult to set the ROM block in the write inhibit or erase inhibit mode, as the need arises.

The NAND flash memory has a plurality of blocks. The data is erased in blocks. The faulty block which has a faulty cell is replaced with a redundancy block. However, when the number of faulty blocks is larger than that of redundancies, the product is shipped as a partially good product, with the faulty block left. In this case, to recognize the faulty block, data "0" is written in the first several bits of the faulty block. When the faulty block is accessed, data "0" is outputted. Data "0" is not always written into the cells in the faulty block. It might not be written into them. In this case, although most of the memory cells are good, the product must be discarded. As a result, this results in a decrease in the yield.

Accordingly, there have been demands for a semiconductor memory device capable of not only storing security information reliably but also, when a faulty block is present in part of the memory, recognizing the faulty block reliably.

BRIEF SUMMARY OF THE INVENTION

According to an aspect of the invention, there is provided a semiconductor memory device comprising: a memory cell array with a first and a second storage area, the first storage area having a plurality of memory elements selected by an address signal and the second storage area having a plurality of memory elements selected by a control signal; and a control circuit which has a fuse element and, when the fuse element has been blown, inhibits at least one of writing and erasing from being done on the second storage area.

BRIEF DESCRIPTION OF THE SEVERAL VIEWS OF THE DRAWING

FIGS. 6A, 6B, 6C, and 6D show the relationship between the addresses read in each mode and the I/O terminals;

FIGS. 7A and 7B are tables showing the operations of the predecoder and column RD decoder in FIG. 1;

FIGS. 8A, 8B, and 8C are circuit diagrams of the CG driving circuit in FIG. 1 and FIG. 8D is a table showing the operation of the circuit in FIG. 8C;

FIG. 9A is a table showing the operation of the array block circuit in FIG. 1 and FIG. 9B is a circuit diagram of a latch circuit;

FIG. 10 is a diagram to help explain the operation of the block RD decode circuit in FIG. 1;

FIG. 11 is a table showing the operation of the block decoder in FIG. 1;

FIG. 12 is a circuit diagram of the block select circuit;

FIG. 15A is a circuit diagram of the write inhibit circuit 15a in FIG. 1 and FIG. 15B is a circuit diagram of the erase inhibit circuit 15b;

FIG. 17A shows the relationship between the data in a memory cell and the written and read data and FIGS. 17B and 17C are tables to help explain the number of writes;

FIG. 19 is a waveform diagram showing the sequence of a program operation;

FIG. 20 is a waveform diagram showing the sequence of a double-speed program operation;

FIG. 21 is a flowchart for the first-page program operation;

FIG. 23 is a waveform diagram showing the sequence during the first-page program;

FIG. 24 is a table showing the operation of the first-page program verify read;

FIGS. 26A, 26B, and 26C are tables showing the operation of the second-page program verify read;

FIG. 29 is a waveform diagram showing the sequence for a read operation;

FIG. 31 is a flowchart schematically showing a read operation;

FIG. 32 is a table showing the second-page read operation;

FIGS. 33A and 33B are tables showing the first-page read operation;

FIG. 41 shows the configuration of a voltage setting circuit in the control voltage generating circuit of FIG. 1;

FIG. 44 is a table showing the operation of the first-page and second-page simultaneous program;

FIGS. 45A, 45B, 45C, and 45D are tables showing the operation of the first-page and second-page simultaneous program;

FIG. 46 is a flowchart showing the operation of the first-page and second-page simultaneous program.

DETAILED DESCRIPTION OF THE INVENTION

Hereinafter, referring to the accompanying drawings, embodiments of the present invention will be explained.
(First Embodiment)

Figure 1:
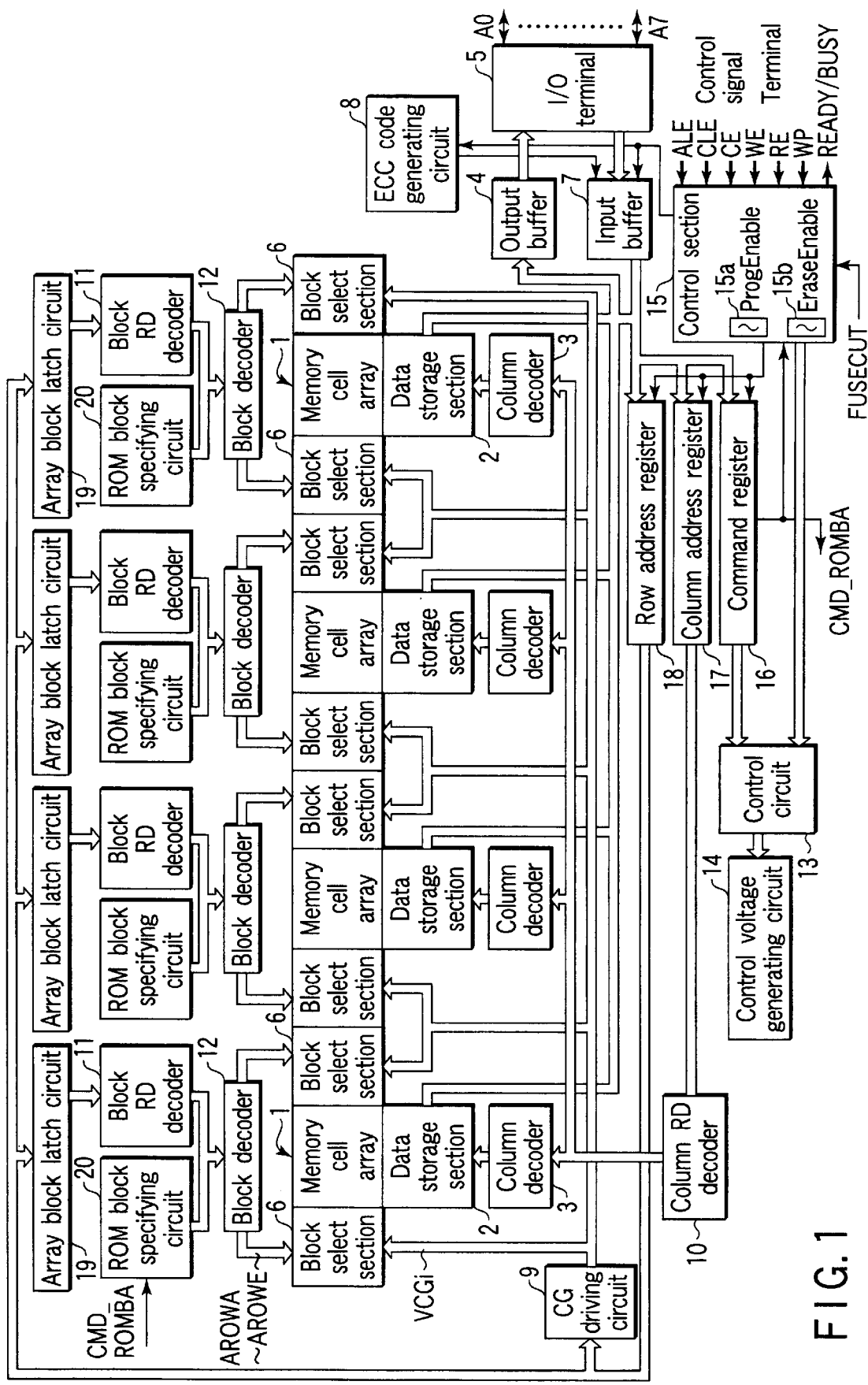
FIG. 1 shows the configuration of a semiconductor memory device according to a first embodiment of the present invention.

FIG. 1 shows the configuration of a semiconductor memory device according to a first embodiment of the present invention. The semiconductor memory device will be explained briefly by reference to FIG. 1.

A memory cell array 1 includes a plurality of bit lines (not shown), a plurality of word lines (not shown), and a common read line (not shown). In the memory cell array 1, electrically rewritable memory cells are arranged in a matrix. The inside of each memory cell array 1 is divided into a plurality of blocks and a plurality of redundancy blocks as explained later. At one end of each memory cell array 1 in the direction of column, a data storage section 2 is provided. On each side of each memory cell array 1 in the direction of row, a block select section 6 is provided.

The data storage section 2 includes a plurality of data storage circuits as described later. Each data storage circuit has the following functions: (1) reading the data from a memory cell in the memory cell array via a bit line; (2) sensing the state of a memory cell in the memory cell array 1 via a bit line; and (3) applying a write control voltage to a memory cell in the memory cell array 1 via a bit line and writing data into the memory cell.

A column decoder 3, an input buffer 7, and an output buffer 4 are connected to each data storage section 2. The input buffer 7 and output buffer 4 are connected to an I/O terminal 5.

Each of the column decoders 3 selects a data storage circuit in the data storage section 2. The data in the memory cell read by the data storage circuit selected by the column decoder 3 is outputted via the output buffer 4 from the I/O terminal 5 to the outside world. The write data inputted from the outside world to the I/O terminal 5 is supplied via the input buffer 7 to the data storage circuit 2 selected by the column decoder 3.

According to signals ALE, CLE, CE, WE, RE, and WP supplied from the outside world, a control section 15 controls the output buffer 4, input buffer 7, an ECC code generating circuit 8, a control circuit 13, a command register 16, a column address register 17, and a row address register 18. The control section 15 further includes a write inhibit circuit 15a for inhibiting a ROM block explained later from being written into and an erase inhibit circuit 15b for inhibiting the ROM block from being erased from. The control section 15 further includes a fuse for switching the setting mode of the semiconductor memory device as described later.

The ECC code generating circuit 8 generates ECC (error correction code) under the control of the control section 15 and supplies the ECC to the input buffer 7.

The command register 16 supplies the command supplied from the input buffer 7 to the control circuit 13. According to the command, the control circuit 13 controls each section. A control voltage generating circuit 14 is connected to the control circuit 13. The control voltage generating circuit 14, which is composed of, for example, a charge pump circuit, generates the voltage necessary to write, read, or erase the data.

The column address register 17 supplies the address supplied from the input buffer 7 to a column RD (redundancy) decoder and a column predecoder 10. The column RD (redundancy) decoder and a column predecoder 10 not only decode a column redundancy address but also predecode a column address. The output signal of the column RD decoder and column predecoder 10 is supplied to each of the column decoders 3.

The row address register 18 supplies the address supplied from the input buffer 7 to the CG (control gate) driving circuit 9 and array block latch circuit 19.

The CG driving circuit 9 selects the potential of the word line generated by the control voltage generating circuit 14 according to the row address supplied from the row address register 18 and supplies the selected potential to the block select section 6.

A block decoder 12 is connected to the block select section 6. A block RD (redundancy) decoder 11 and a ROM block specifying circuit 20 are connected to the block decoder 12. The array block latch circuit 19 is connected to the block RD decoder 11. The row address register 18 is connected to the array block latch circuit 19.

The block select section 6 selects a block in the memory cell array 1 according to the output signals of the array block latch circuit 19, block RD decoder 11, and block decoder 12. Furthermore, the block select section 6 selects a transfer gate explained later according to the row address in reading, writing, or erasing the data and supplies the voltage supplied from the CG driving circuit 9 to a word line in the memory cell array 1.

The ROM block specifying circuit 20 specifies a redundancy block in the memory cell array as a ROM block. That is, in the first embodiment, any redundancy block in the memory cell array can be specified as a ROM block. In the ROM block, a recognition code or the like for security is written during the manufacturing process. For this reason, the ROM block is so constructed that it is not selected in a test, such as simultaneous writing or simultaneous erasing.

Figure 2:
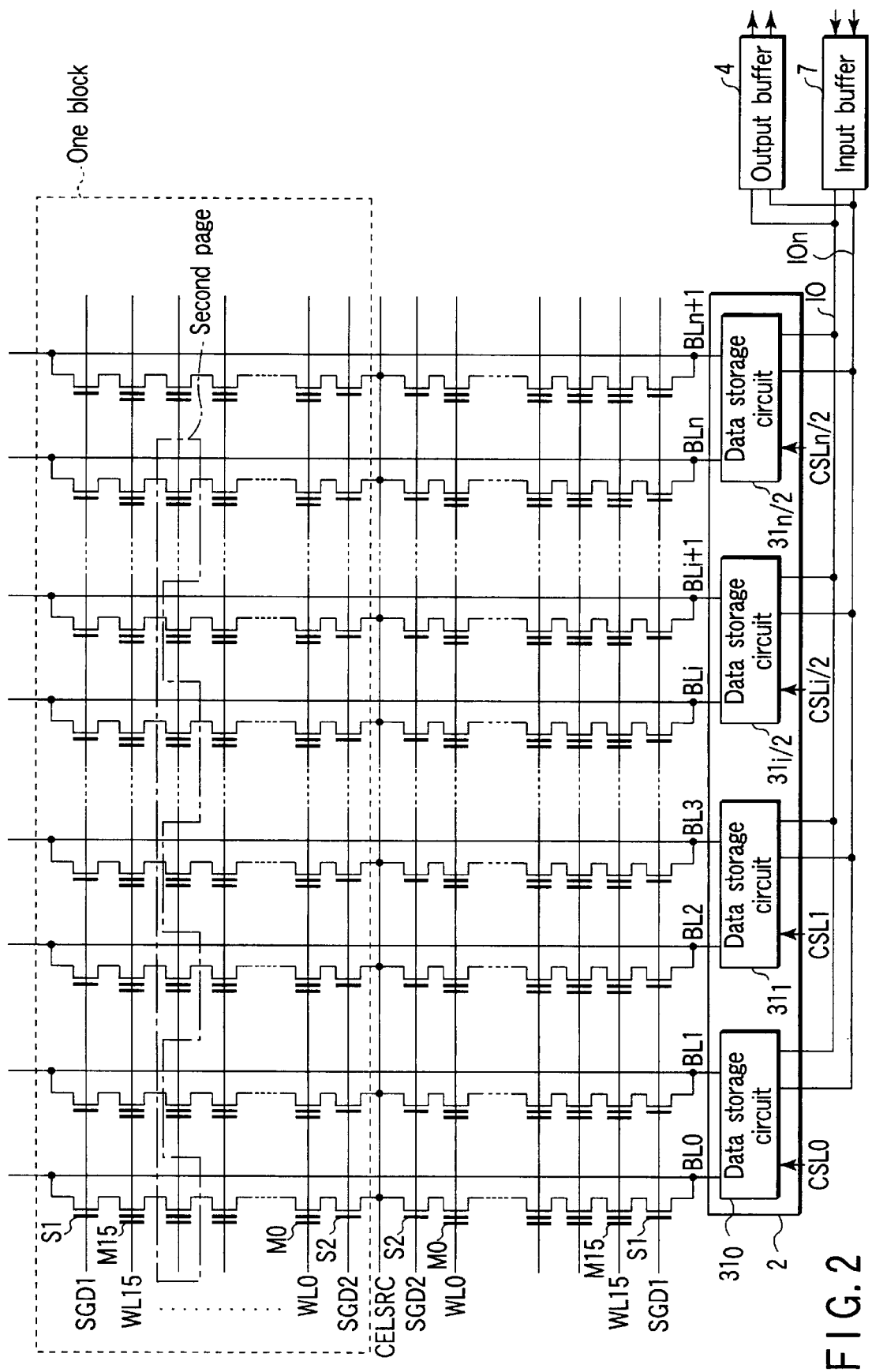
FIG. 2 is a circuit diagram of the memory cell array 1 and data storage section 2 shown in FIG. 1.

FIG. 2 shows the configuration of the memory cell array 1 and data storage section 2 of FIG. 1. The data storage section 2 includes a plurality of data storage circuits $31_0$, $31_1$ to $31_{n/2}$. The data storage circuits $31_0$, $31_1$ to $31_{n/2}$, which are connected to the input buffer 4 and output buffer 7, are controlled by the column select signals CSL0, CSL1 to CSLn/2 supplied from the column decoder 3.

A pair of bit lines are connected to each of the data storage circuits $31_0$, $31_1$ to $31_{n/2}$. That is, bit lines BL0, BL1 are connected to the data storage circuit $31_0$, bit lines BL2, BL3 are connected to the data storage circuit $31_1$, and bit lines BLn, BLn+1 are connected to the data storage circuit $31_{n/2n}$.

In the memory cell array 1, a plurality of NAND cells are provided. A NAND cell is composed of series-connected memory cells M0 to M15 made up of, for example, 16 EEPROMs, a first select gate S1 connected to memory cell M15, and a second select gate S2 connected to memory cell M0. The first select gate S1 is connected to bit line BL0 and second select gate S2 is connected to source line CELSRC. The control gates of the memory cells M0 to M15 provided in each row are connected in common to the word lines WL0 to WL15. The first select gate S1 is connected in common to a select line SGD1. The second select gate S2 is connected in common to a select line SGD2.

In a read operation, a program verify operation, or a program operation, one of the two bit lines (BLi, BLi+1) connected to the data storage circuit is selected by an externally specified address. Furthermore, one word line is selected by the external address. In the case of binary values, cells for one page are selected. In the case of quadrual data, cells for two pages shown in FIG. 2 by a dashed line are selected.

The erase operation is carried out in blocks shown by a dotted line in FIG. 2. That is, the data is erased in blocks. A block is composed of a plurality of NAND cells. The erase operation is performed simultaneously on the two bit lines (BLi, BLi+1) connected to the data storage circuit.

In an erase verify operation, a verify read operation is performed on one (BLi) of the two bit lines (BLi, BLi+1) connected to the data storage circuit in a single operation. Thereafter, a verify read operation is carried out on the other bit line (BLi+1).

Figure 3A:
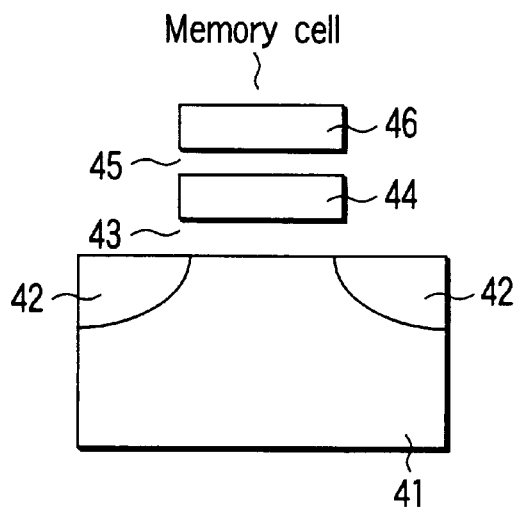
FIGS. 3A and 3B are a sectional view of a memory cell and that of a select transistor, respectively.
Figure 3B:
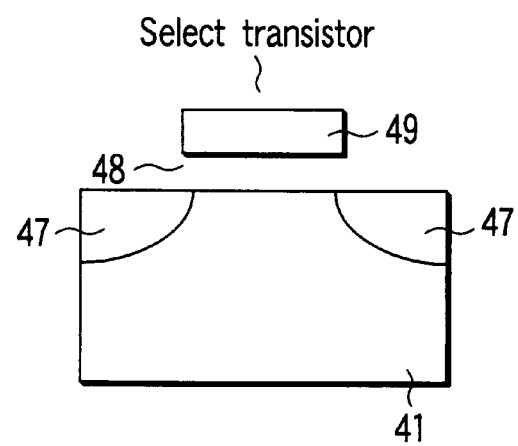

FIGS. 3A and 3B are sectional views of a memory cell and a select transistor. FIG. 3A shows a memory cell. In a substrate 41, n-type diffused layers 42 are formed as the source and drain of a memory cell. Above the substrate 41, a floating gate 44 is formed via a gate insulating film 43. A control gate 46 is formed via an insulating film 45 above the floating gate 44.

FIG. 3B shows a select transistor. In the substrate 41, n-type diffused layers 47 are formed as the source and drain of a select transistor. Above the substrate 41, a control gate 49 is formed via a gate insulating film 48.

Figure 4:
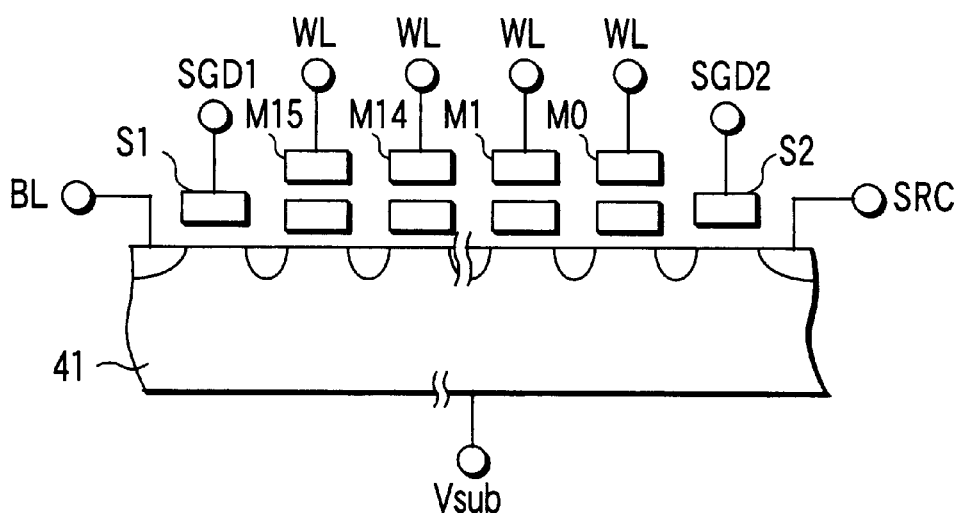
FIG. 4 is a sectional view of a NAND cell in the memory cell array.

FIG. 4 is a sectional view of a NAND cell in the memory cell array. In this example, a NAND cell is composed of 16 memory cells M0 to M15 connected in series. Each memory cell is constructed as shown in FIG. 3A. On the drain side and source side of the NAND cell, a first select gate S1 and a second select gate S2 are provided respectively. Each of the first select gate s1 and second select gate s2 has the configuration shown in FIG. 3B.

Figure 5:
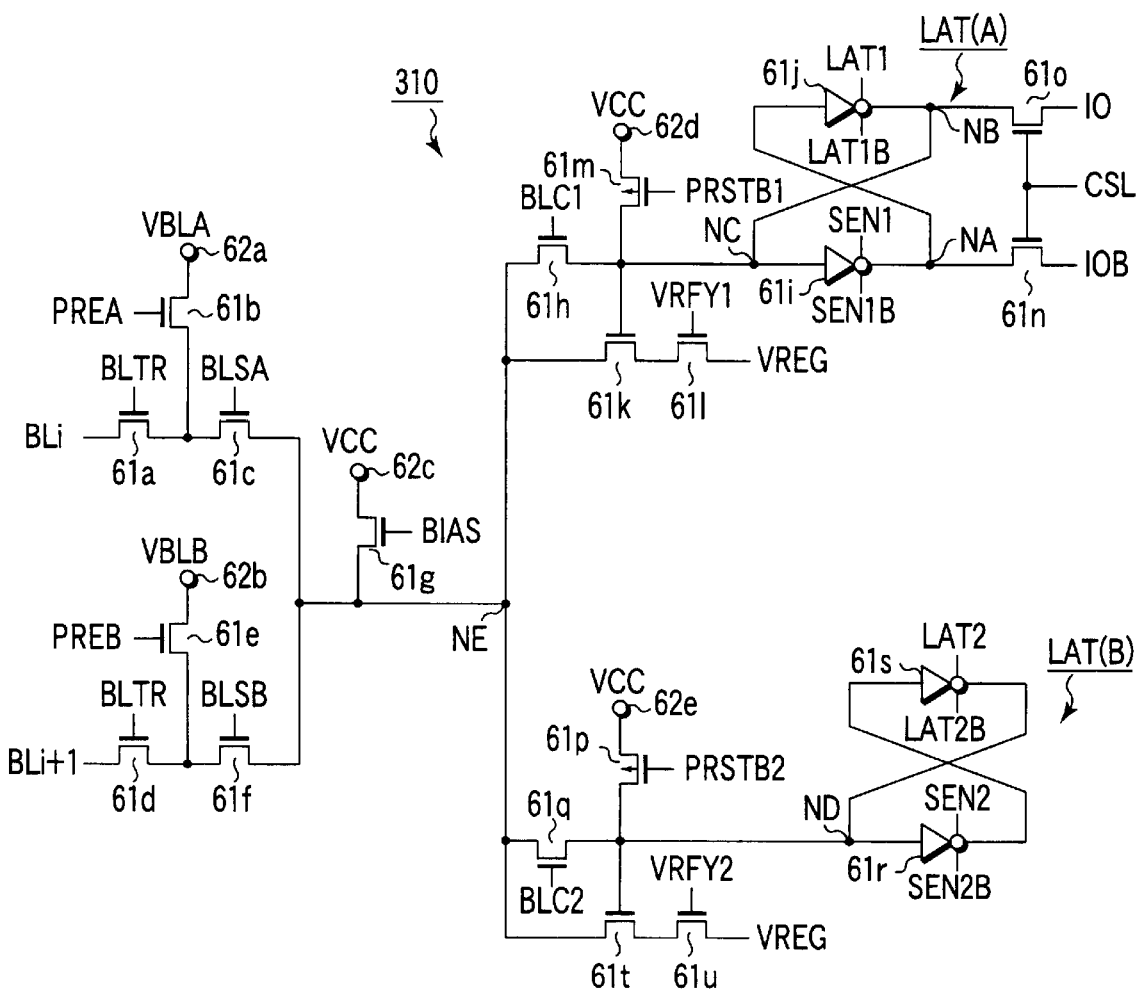
FIG. 5 is a circuit diagram showing the configuration of the data storage circuit shown in FIG. 2.

FIG. 5 is a circuit diagram showing the configuration of the data storage circuit $31_0$ in FIG. 2. Since all the data storage circuits have the same configuration, only the data storage circuit $31_0$ will be explained.

One end of the current path of an n-channel transistor 61a is connected to bit line BLi. Signal BLTR is supplied to the gate of the transistor 61a. The other end of the current path of the transistor 61a is connected to one end of the current path of a transistor 61b and one end of the current path of a transistor 61c. The other end of the current path of the transistor 61b is connected to a terminal 62a. Voltage VBLA is supplied to the terminal 62a. Signal PREA is supplied to the gate of the transistor 61b. Signal BLSA is supplied to the gate of the transistor 61c.

One end of the current path of an n-channel transistor 61d is connected to bit line BLi+1. The signal BLTR is supplied to the gate of the transistor 61d. The other end of the current path of the transistor 61d is connected to one end of the current path of a transistor 61e and one end of the current path of a transistor 61f. The other end of the current path of the transistor 61e is connected to a terminal 62b. Voltage VBLB is supplied to the terminal 62b. Signal PREB is supplied to the gate of the transistor 61e. Signal BLSB is supplied to the gate of the transistor 61f. The transistors 61b, 61e precharge the unselected bit lines to the potentials VBLA, VBLB according to the signals PREA, PREB, respectively. The transistors 61c, 61f select a bit line according to the signals BLSA, BLSB, respectively.

The other ends of the current paths of the transistors 61c, 61f are connected via a transistor 61g to not only a terminal 62c but also a node NE. Signal BIAS is supplied to the gate of the transistor 61g. Voltage VCC is supplied to the terminal 62c. The transistor 61g precharges a bit line according to signal BIAS in reading the data.

One end of the current path of a transistor 61h is connected to the node NE. Signal BLC1 is connected to the gate of the transistor 61h. A terminal 62d is connected via a p-channel MOS transistor 61m to the other end of the current path of the transistor 61h. Voltage VCC is supplied to the terminal 62d. Signal PRSTB1 is supplied to the gate of the transistor 61m.

A first latch circuit LAT(A) is connected to the other end of the current path of the transistor 61h. The first latch circuit LAT(A) is composed of two clocked inverter circuits 61i, 61j. The clocked inverter circuit 61i is controlled by signals SEN1, SEN1B (B means an inverted signal). The clocked inverter circuit 61j is controlled by signals LAT1, LAT1B. The first latch circuit LAT(A) latches the writing data.

One end of the current path of an n-channel MOS transistor 61o is connected to the output node NB of the clocked inverter circuit 61j and the junction node NC of the input terminal of the clocked inverter circuit 61i. The other end IO of the current path of the transistor 61o is connected to the input buffer 7 and output buffer 4.

One end of the current path of an n-channel MOS transistor 61n is connected to the output node NA of the clocked inverter circuit 61i and the junction node of the input terminal of the clocked inverter circuit 61j. The other end IOB of the current path of the transistor 61n is connected to the input buffer 7 and output buffer 4. The column decoder 3 supplies a column select signal CSL to the gates of the transistors 61o, 61n.

Transistors 61k, 61l are connected in series with the node NE. The gate of the transistor 61k is connected to the node NC of the first latch circuit LAT(A). Signal VRFY1 is supplied to the gate of the transistor 61l. Signal VREG is supplied to the current path of the transistor 61l. The transistors 61k, 61l set the potential of the bit line according to the data latched in the first latch circuit LAT(A).

On the other hand, one end of the current path of a transistor 61q is connected to the node NE. Signal BLC2 is supplied to the gate of the transistor 61q. A terminal 62e is connected via a p-channel MOS transistor 61p to the other end of the current path of the transistor 61q. Voltage VCC is supplied to the terminal 62e. Signal PRSTB2 is supplied to the gate of the transistor 61p.

A second latch circuit LAT(B) is connected to the other end of the current path of the transistor 61q. The second latch circuit LAT(B) is composed of two clocked inverter circuits 61r, 61s. The clocked inverter circuit 61r is controlled by signals SEN2, SEN2B. The clocked inverter circuit 61s is controlled by signals LAT2, LAT2B. The second latch circuit LAT(B) latches the data read from a memory cell.

Transistors 61t, 61u are connected in series with the node NE. The gate of the transistor 61t is connected to the node ND of the second latch circuit LAT(B). Signal VREY2 is supplied to the gate of the transistor 61u. Signal VREG is supplied to the current path of the transistor 61u. The transistors 61t, 61u set the potential of the bit line according to the data latched in the second latch circuit LAT(B).

With the above configuration, the operation will be explained.

(Command Input)

With signal CLE supplied to the control section 15 of FIG. 1 being high, when signal WE rises or falls, the data supplied to the I/O terminal 5 is supplied as a command to the command register 16.

(Address Input)

With signal ALE from the control section 15 of FIG. 1 being high, when signal WE rises or falls, the data supplied to the I/O terminal 5 is taken in as an address.

FIGS. 6A, 6B, 6C, and 6D show the relationship between the address read in each mode and the I/O terminal. It is assumed that the semiconductor memory device of the first embodiment enables the memory cell array to be switched between, for example, four modes. Switching between the four modes is realized by blowing, for example, a fuse (not shown) provided in the control section 15.

FIG. 6A shows a case where 1 G (giga) bits are stored using a quadrual data storing technique whereby two bits are stored in a cell in a 32-KB block size mode. FIG. 6B shows a case where 512 M (mega) bits are stored using a binary data storing technique whereby one bit is stored in a cell in a 16-KB block size mode. FIG. 6C shows a case where 1 G (giga) bits are stored using a quadrual data storing technique in a 128-KB block size mode. FIG. 6D shows a case where 512 M (mega) bits are stored using a binary data storing technique in a 64-KB block size mode.

In each operation mode, the read or program operation takes in a column address, block address, and the like in four cycles. The erase operation, however, need not take in a column address, so that the first cycle is omitted and the address is inputted in three cycles, from the second cycle to the fourth cycle.

In the case of quadrual data shown in FIGS. 6A and 6C, it is necessary to switch between the first and second pages. The switching is done using the second cycle MLAdd. In the case of binary data, only one bit is stored in a cell, which eliminates the need of switching between the pages.

Switching between the column addresses A8, A8E shown in FIG. 6A is effected by a command and the resulting column address is inputted.

(Data Input)

When the writing data is inputted, the signal ALE and signal CLE from the control section 15 of FIG. 1 are both made low, the data supplied to the I/O terminal 5 is taken in as data when the signal WE rises or falls. The data is supplied to the data storage circuit selected by the column decoder 3. Toggling the signal WE consecutively causes the column address to be incremented, thereby taking in the data in the next address sequentially.

(Data Output)

When the data read from a memory cell is outputted to the outside world, the signal ALE and signal CLE from the control section 15 of FIG. 1 are both made low. In this state, when the signal RE rises or falls, the data in the data storage circuit selected by the column decoder 3 is outputted at the I/O terminal 5. Toggling the signal RE repeatedly causes the address to be incremented, thereby outputting the data in the next address sequentially.

(Predecoder and Column RD Decoder)

FIGS. 7A and 7B are tables to help explain the operation of the predecoder and column RD decoder 10.

The column address register 17 of FIG. 1 not only latches the addresses A0 to A8, A8E externally specified but also increments the address in synchronization with signal WE and signal RE. When ECC is used, 21 columns have to be added to the 528 columns of the column address to store an ECC code. That is, for example, to correct two bits, 21 bits of cells for a correction code are necessary for one page (528 bits). Of the 21 columns, four columns are shared with the column redundancies. As a result, the column address is increased by 17 columns.

As shown in FIG. 7A, the column predecoder and column RD decoder 10 decode the column addresses A0 to A8, A8E and output column predecode signals CA0 to CA7, CB0 to CB7, and CC0 to CC8. In this way, 528+17 columns are selected.

As shown in FIG. 7B, when a column redundancy is selected, the column predecode signal is stopped and column redundancy select signals CSS0 to CSS7 are outputted. In the first embodiment, when ECC is not used, eight column redundancies are present for one array. When ECC is used, four redundancies are present for one array, 17 columns are selected by the signal CA0 to CA7, CB0 to CB8, and four columns are selected by the signals CSS0 to CSS3.

According to the signals CA0 to CA7, CB0 to CB7, CC0 to CC8 outputted from the column predecoder and column RD decoder 10, the column decoder 3 selects one from the 528 columns. The signals CSS0 to CSS7 select directly one column without being decoded.

The row address register 18 of FIG. 1 latches the addresses A9 to A26 externally specified.

FIGS. 8A, 8B, and 8C show the CG driving circuit 9 of FIG. 1.

In the read or program operation, the circuit of FIG. 8A and that of FIG. 8B generate a select CG voltage Vcgsel and an unselect CG voltage Vcgusel respectively. The select CG voltage Vcgsel is set to a voltage Vcgrv in the read operation and to a voltage Vpgmh in the program operation. The unselect CG voltage Vcgusel is set to a voltage Vread in the read operation and to a voltage of Vpass in the program operation.

FIG. 8A shows a circuit for generating the potential of the selected control gate line. The circuit is composed of boost circuits 81a, 81b and transistors 81c, 81d. A program voltage Vpgmh supplied from the control voltage generating circuit 14 is supplied to one end of the current path of the transistor 81c. The output terminal of the boost circuit 81a is connected to the gate of the transistor 81c. The program voltage Vpgmh and signal VPGMEN are supplied to the boost circuit 81a. The boost circuit 81a generates a voltage Vpgmh+Vth according to the signal VPGMEN, which enables the transistor 81c to output the voltage Vpgmh.

The voltage Vcgrv supplied from the control voltage generating circuit 14 is supplied to one end of the current path of the transistor 81d. The output terminal of the boost circuit 81b is connected to the gate of the transistor 81d. The voltage Vcgrv and signal VCGREN are supplied to the boost circuit 81b. The boost circuit 81b generates a voltage Vcgrv+Vth according to the signal VCGREN, which enables the transistor 81d to output the voltage Vcgrv. The other ends of the current paths of the transistors 81c, 81d are connected to each other at the connection node. From the connection node, the select CG voltage Vcgsel made up of the voltage Vpgmh or voltage Vcgrv is outputted.

FIG. 8B shows a circuit for generating the potential of the unselected control gate line. The circuit is composed of boost circuits 82a, 82b and transistors 82c, 82d. The voltage Vpass supplied from the control voltage generating circuit 14 is supplied to one end of the current path of the transistor 82c. The output terminal of the boost circuit 82a is connected to the gate of the transistor 82c. The voltage Vpass and signal VPASSENB are supplied to the boost circuit 82a. The boost circuit 82a generates a voltage Vpass+Vth according to the signal VPASSENB, which enables the transistor 82c to output the voltage Vpass.

The voltage Vreadh supplied from the control voltage generating circuit 14 is supplied to one end of the current path of the transistor 82d. The output terminal of the boost circuit 82b is connected to the gate of the transistor 82d. The voltage Vreadh and signal VREADEN are supplied to the boost circuit 82b. The boost circuit 82b generates a voltage Vreadh+Vth according to the signal VREADEN, which enables the transistor 82d to output the voltage Vreadh. The other ends of the current paths of the transistors 82c and 82d are connected to each other at a connection node. From the connection node, an unselect CG voltage Vcgusel made up of the voltage Vpass or Vreadh is outputted.

FIG. 8C shows a CG supply circuit for supplying a select CG voltage Vcgsel or an unselect CG voltage Vcgsel to a control gate. Sixteen units of the CG supply circuit are provided so as to correspond to the control gates. On the basis of address A11 to address A14, one of them is brought into the selected state and the remaining 15 CG supply circuits are made unselected.

Specifically, the CG supply circuit is composed of a decode circuit 83a, an inverter circuit 83b, boost circuits 83c, 83d, and transistors 83e, 83f, 83g. Address A11 to address A14 are supplied to the input terminal of the decode circuit 83a. When the CG supply circuit is selected according to the address, the boost circuit 83c turns on the transistor 83e, thereby outputting the select CG voltage Vcgsel as a control gate voltage VCGi. When the CG supply circuit is not selected, the boost circuit 83d turns on the transistor 83f, thereby outputting the unselect CG voltage Vcgsel as a control gate voltage VCGi.

In an erase operation, the signal ERASEEN is made high, thereby turning on the transistor 83g, which forces all the control gate voltages VCG0 to VCG15 to the ground potential.

FIG. 8D shows the relationship between address A11 to address A14 and the control gate voltage VCGi. FIG. 8D shows that one control gate voltage VCGi is outputted on the basis of address A11 to address A14.

In this way, the control gate voltage VCGi is switched in two stages of the circuits shown in FIGS. 8A and 8B and that in FIG. 8C. As a result, each of the CG supply circuits can output all the necessary potentials for read, program, and erase operations. Moreover, using the two-stage circuit configuration makes the size of the circuit smaller.

FIGS. 9A and 9B show one of the array block latch circuits 19 of FIG. 1. The array block latch circuit 19 latches a block address (A17 to A26) for the corresponding memory cell array.

As shown in FIG. 9A, the four memory cell arrays are selected using address A15 and address A16. The latch signals PBLATPB0 to PBLATPB3 of the selected memory cell array go high.

FIG. 9B is a latch circuit provided in the array block latch circuit 19. The latch circuit is provided so as to correspond to each of block address A17 to block address A26. The latch circuit is composed of an inverter circuit 91a, a NAND circuit 91b, and NAND circuits constituting a flip-flop circuit. The latch circuit latches block addresses A17 to A26 when the latch signals PBLATPB0 To PBLATPB3 go high.

FIG. 10 shows the operation of the block RD decoder 11 of FIG. 1. When the block addresses A17 to A26 supplied from the array block latch circuit 19 coincide with the block redundancy addresses APB17 to APB26 set by the fuse, the block RD decoder 11 outputs the addresses ATPB17 to ATPB26 and a signal ATPBD for selecting the redundancy area. The addresses ATPB17 to ATPB26 and signal ATPBD are used to select one of the block redundancies.

Specifically, FIG. 10 shows a case where the block addresses A17 to A26 have coincided with the block redundancy addresses APB17 to APB26. In this case, the block RD decoder 11 brings block address ATPB18 and the signal ATPBRD for selecting the redundancy area into the high level to select the block redundancy in, for example, ATPB18.

FIG. 11 shows the operation of the block decoder 12 of FIG. 1. The block decoder 12 decodes the block addresses ATPB17 to ATPB26 and ATPBRD supplied from the block RD decoder 11 and outputs row decode signals AROWA to AROWE and RDECPBLR as shown in FIG. 11. The row decode signals AROWA to AROWE are for selecting a block in the memory cell array 1. RDECPBLR is a signal for selecting one of the block select sections 6 provided on both sides (on the right and left sides) of the memory cell array 1.

When the ROM block specifying circuit 20 has been selected, the block decoder 12 decodes the block address supplied from the ROM block specifying circuit 20 as described above and generates row decode signals AROWA to AROWE for selecting a ROM block.

FIG. 12 shows the configuration of the block select circuit 6a in the block select section 6 of FIG. 1. The block select circuit 6a is provided for each block. The fuse state sensing circuit 6b of FIG. 12 is provided for each memory cell array 1.

Figure 13:
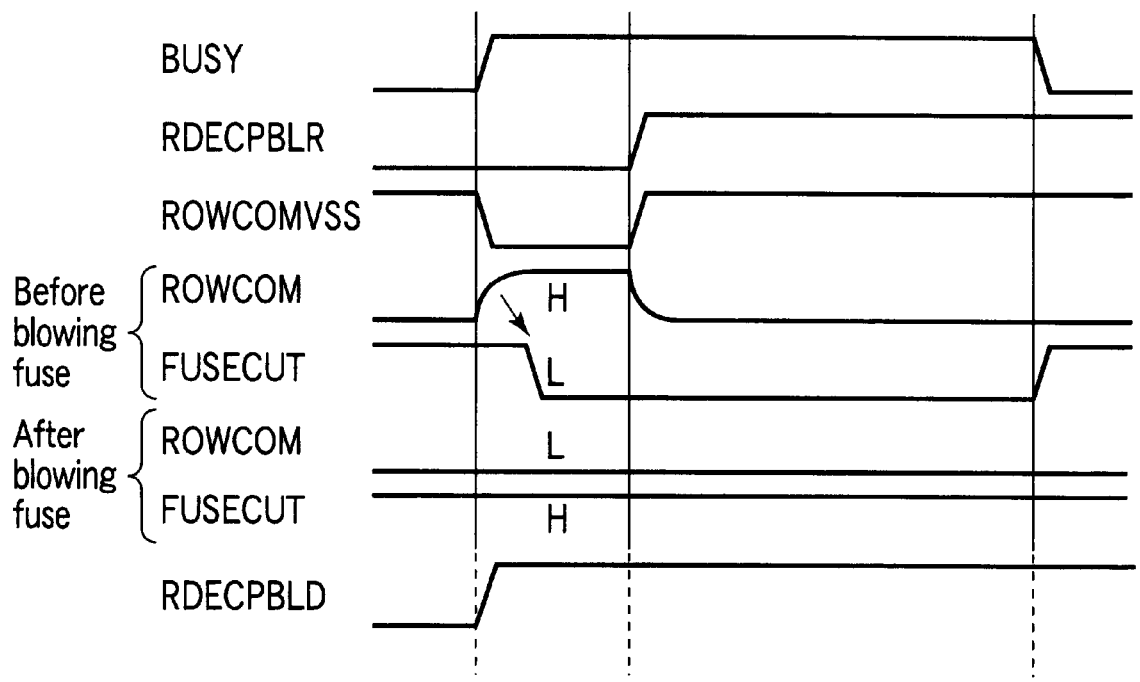
FIG. 13 is a waveform diagram showing the operation of the circuit in FIG. 12.

In the block select circuit 6a, a power supply voltage VDD is supplied to a terminal 100. A p-channel MOS transistor 101 and n-channel MOS transistors 102 to 108 are connected in series between the terminal 100 and a node to which signal ROWCOM is supplied. The signal RDECP-BLR is supplied to the gate of the transistor 101. The signal RDECPBLR is a signal for selecting either the right-side or left-side block select section 6 of the memory cell array 1. The row decode signals AROWA to AROWE are supplied to the gates of the transistors 102 to 106. Signal RDECPBLRD is supplied to the gate of the transistor 107. Signal RDECPBL changes a little later than the signal RDECP-BLRD as shown in FIG. 13.

A command signal CD_ROMBA for accessing a ROM block is supplied to the gate of the transistor 108. A fuse 109 is connected in parallel with the transistor 108. The fuse 109 is blown, when the block corresponding to the block select circuit 6a is a faulty block.

A series circuit of p-channel MOS transistors 117, 118 is connected in parallel with the transistor 101. The gate of the transistor 117 is grounded (in the figure, the downward arrow means grounding). The input terminal of an inverter circuit 119 is connected to the connection node of the transistors 101, 102, 118. The output terminal of the inverter circuit 119 is connected not only to the gate of the transistor 118 but also to one input terminal of a level shifter 120.

A signal VRDEC is supplied to the other input terminal of the level shifter 120. The signal VRDEC is a signal for controlling the level shifter 120 according to the operation of programming, reading, or erasing the data. When the block select circuit 6a has been selected, the level shifter 120 generates a signal for driving the transfer gate TG according to the signal VRDEC.

The transfer gate TG includes transfer gates TG0 to TG15 connected to the word lines of the memory cells and transfer gates TGS1, TGS2 connected to first and second select gates S1, S2. Control gate lines CG0 To CG15 are connected to the one-end sides of the current paths of the transfer gates TG0 To TG15, respectively. Word lines WL0 To WL15 are connected to the other ends of the current paths, respectively. The CG driving circuit 9 supplies the control gate voltage VCG to the control gate lines CG0 To CG15.

Select gate lines SGD, SGS are connected to the one-end sides of the current paths of transfer gates TGS1, TGS2, respectively. Select lines SGD1, SGD2 are connected to the other ends of the current paths. For example, the control voltage generating circuit 14 supplies a specific voltage to the select lines SGD1, SGD2.

To the select line SGD1, n-channel MOS transistors 121, 122 are connected in series. Signal SGDSPBLR is supplied to one end of the current path of the transistor 121. Signal RDECADin+1n is supplied to the gate of the transistor 121. Further supplied via an inverter circuit 123 to the gate of the transistor 122 is the output signal RDECADn of the inverter circuit 119.

One end of the current path of an n-channel MOS transistor 124 is connected to the select line SGD2. The signal SGDSPBLR is supplied to the other end of the current path of the transistor 124. The signal RDECADn is supplied to the gate of the transistor 124.

In the fuse state sensing circuit 6b, the node to which the signal ROWCOM is supplied is not only grounded via an n-channel MOS transistor 110 but also connected to the gate of an n-channel MOS transistor 111. Signal ROWCOMVSS is supplied to the gate of the transistor 110. One end of the current path of the transistor 110 is connected to the input terminal of an inverter circuit 112 and the output terminal of an inverter circuit 113. The other end of the current path is grounded. The output terminal of the inverter circuit 112 and the input terminal of the inverter circuit 113 are connected to the input terminal of an inverter circuit 114. The output terminal of the inverter circuit 114 outputs a signal FUSECUT for indicating whether or not the fuse has been blown. The signal FUSECUT is supplied to the control section 15. The input terminal of the inverter circuit 114 is grounded via an n-channel MOS transistor 115. Signal BUSY is supplied via an inverter circuit 116 to the gate of the transistor 115.

With the above configuration, the operation of the block select circuit 6a will be explained.

Signal RDECPBLR, signal RDECPBLRD, signal CMD_ROMBA, and signal ROWCOM are normally at the ground potential VSS, which makes the output signal RDECAD of the inverter circuit 119 low.

On the other hand, when a read operation, a program operation, or an erase operation is started, the signal RDECPBLR corresponding to either the right side or the left side of the selected memory array goes high. In this state, when the addresses coincide with each other, all the row decode signals AROWA to AROWE go high, making the output signal RDECAD of the inverter circuit 119 high, which activates the level shifter 120. The level shifter 120 outputs a program voltage of Vpgm+Vth (Vth is the threshold voltage of the transfer gate) in a program operation, a read voltage of Vread+Vth in a read operation, or a power-supply voltage of VDD in an erase operation. The level shifter 120 generates such voltages, thereby enabling the transfer gate to transfer the voltage from the CG driving circuit 9 as it is.

On the other hand, when the addresses do not coincide with each other, any one of the row decode signals AROWA to AROWE goes low, which brings the block select circuit 6a into the unselected state. As a result, the output voltage of the level shifter 120 goes to the ground voltage VSS. Therefore, in a read operation or program operation, the word lines WL0 to WL15 go to the floating state. When the signal SGDSPBLR goes to the ground potential VSS and the transistors 121, 122, 123 turn on, the select lines SGD1, SGD2 go to the ground potential VSS.

In an erase operation, the word lines WL0 To WL15 are brought into the floating state and the voltage SGDSPBLR is set at the power-supply voltage VDD. As a result, the potential of the select lines SGD1, SGD2 becomes VDD-Vth. However, since the substrate is set at the erase voltage VERA, both the word lines WL0 To WL15 and select lines SGD1, SGD2 go to potentials close to the erase voltage VERA.

In the case of a faulty block, the fuse 109 of FIG. 12 is blown as described above. In a test, such as simultaneous select write, all the row decode signals AROWA to AROWE are made high. Since the fuse 109 has been blown, however, the output signal RDECAD of the inverter circuit 119 goes low, which prevents the faulty block from being selected.

Furthermore, in a case where the faulty block in the partially good product has been accessed, when the fuse 109 has been blown, the faulty block is not selected. As a result, when a read operation is performed in this state, the cells are off. In binary data, the read data becomes data "0" automatically. In addition, the read data becomes data "0" on the quadrual-data second page, whereas the read data becomes data "1" on the quadrual-data first page. For this reason, before the signal RDECPBLR is made high, the signal ROWCOWVSS is made low temporarily and ROWCOM is brought into the floating state.

FIG. 13 shows a sequence for the operation of sensing the state of the fuse 109 of FIG. 12.

In the state where signal BUSY and signal RDECPBLRD are kept high, signal ROWCOMVSS is made low. In this state, when a block is such that all the row decode signals AROWA to AROWE are high and the fuse 9 has not been blown, the voltage at the node to which the signal ROWCOM is supplied goes to the power supply voltage VDD. As a result, the transistor 111 turns on, which causes the output terminal of the latch circuit composed of the inverter circuits 112, 113 to remain at the high level. Consequently, the output signal FUSECUT of the inverter circuit 114 is low.

On the other hand, when the fuse 109 has been blown, the node to which signal ROWCOM is supplied remains in the floating state (with a potential of VSS). Therefore, the transistor 111 is off, causing the output terminal of the latch circuit made up of the inverter circuits 112, 113 to keep at the low level. Consequently, the output signal FUSECUT of the inverter circuit 114 is high.

Thereafter, signal ROWCOMVSS and signal RDECPBLRD are made high. The latch circuit composed of the inverter circuits 112, 113 remains in the latched state. As a result, when the fuse 109 has been blown, any block is not selected.

As described above, with the circuit of FIG. 12, it is known whether the fuse 109 has been blown. Therefore, with the fuse 109 being blown, when a second read operation is not performed after a first read operation, the output becomes data "0."

In an erase operation where the same data is written into a plurality of cells, when the erasure is insufficient, the value of the data storage circuit becomes data "1" in the erase verify operation, whereas, when the erasure is sufficient, the value becomes data "0." When the fuse has been blown, however, any block has not been selected and the value becomes data "0." For this reason, the erase verify operation is repeated until the maximum number of loops has been reached. In the present invention, to prevent this, the array is prevented from being erased when the signal FUSECUT is high.

Figure 14:
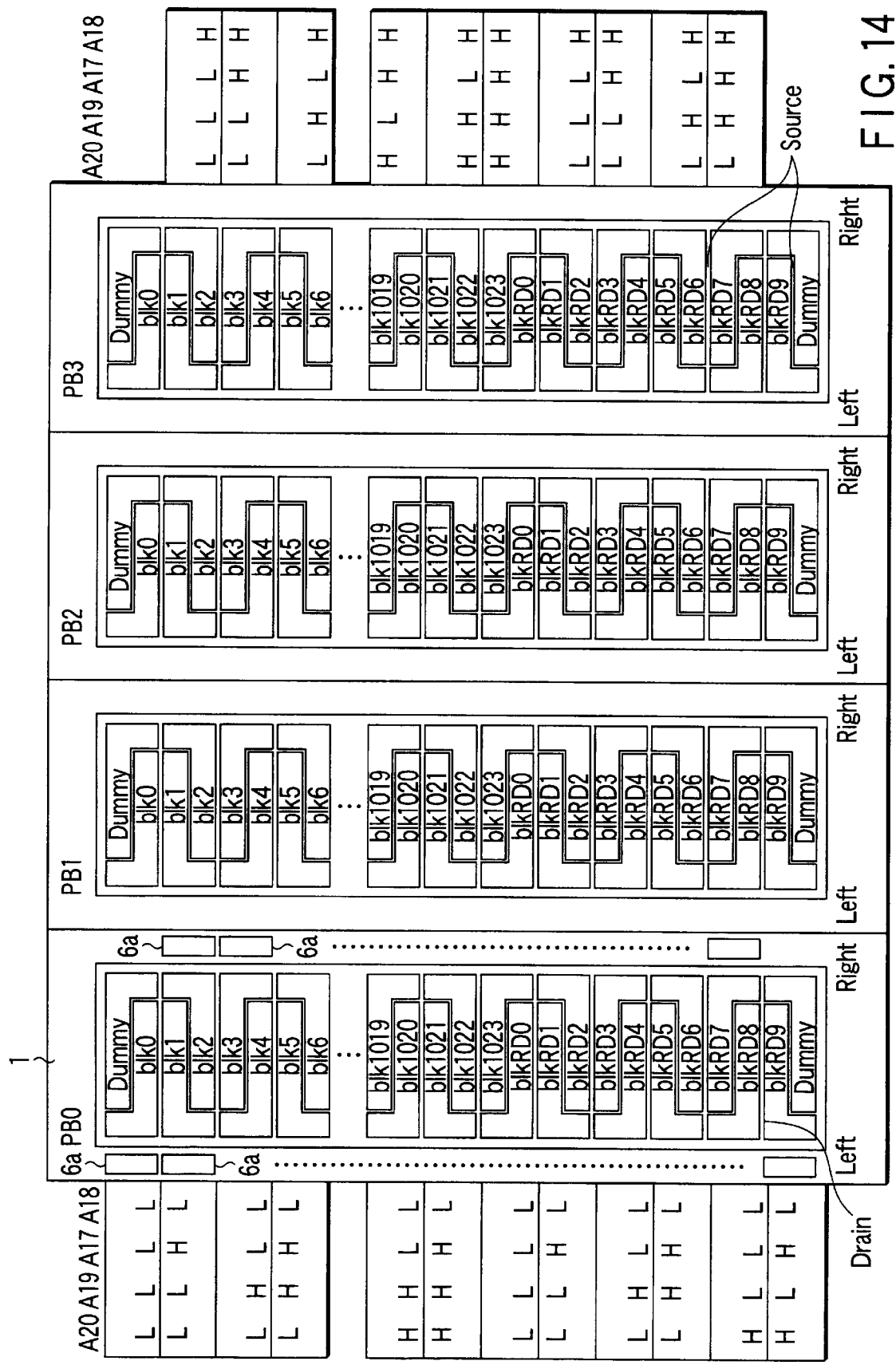
FIG. 14 shows a physical mapping of the memory cell array.

FIG. 14 shows a physical mapping of the memory cell array, where the physical locations to be selected are indicated by addresses.

Each memory cell array 1 includes blocks blk0 To blk23 and block redundancies blkRD0 To blkRD9 as redundancy blocks. Any of the block redundancies blkRD0 To blkRD9 can be used as a ROM block. For example, in a case where block redundancy blkRD1 is used as a ROM block, when the command signal CD_ROMBA for accessing the ROM block is inputted, the block RD decoder 11 of FIG. 1 does not output a signal. At this time, the ROM block specifying circuit 20 outputs signals A16 to A26 for selecting a block redundancy and signal ARD, and then outputs row decode signals AROWA to AROWE so as to select the first block redundancy.

The fuse 109 of the ROM block is normally blown. The reason is that the data is written in the ROM block in a die sort test. Therefore, in a subsequent simultaneous program or simultaneous erase operation, the ROM block is prevented from being selected.

When the ROM block is accessed, however, the command signal CMD_ROMBA is made high in FIG. 12, turning on the transistor 108, which brings the ROM block into the selected state, even when the fuse 109 has been blown.

FIG. 15A shows the write inhibit circuit 15*a* for a ROM block provided in the control section 15 of FIG. 1. FIG. 15B shows the erase inhibit circuit 15*b* for the ROM block 20.

In FIG. 15A, the write inhibit circuit 15*a* is composed of p-channel MOS transistors 151*a*, 151*b*, an n-channel MOS transistor 151*c*, a fuse 151*d*, inverter circuits 151*e*, 115*f*, 151*h*, and a NOR circuit 151*g*. The power supply voltage VDD is supplied to one end of the current path of each of the transistors 151*a*, 151*b*. The other ends of the current paths of them are connected to each other at a junction node. Between the junction node of the transistors and the ground, the transistor 151*c* and fuse 151*d* are connected. Signal LOWVDDn is supplied to the gates of the transistor 151*a* and transistor 151*c*. The junction node is connected via the inverter circuit 151*e* to one input end of the NOR circuit 151*g*. Command signal CMD_ROMBA is supplied via the inverter circuit 151*f* to the other input terminal of the NOR circuit 151*g*. The output terminal of the NOR circuit 151*g* is connected to the input terminal of the inverter circuit 151*h*. Signal PROENABL is outputted from the output terminal of the inverter circuit 151*h*.

The erase inhibit circuit 15*b* of FIG. 15B has the same configuration as that of the write inhibit circuit 15*a*. Specifically, the power supply voltage VDD is supplied to one end of the current path of each of the transistors 152*a*, 152*b*. The other ends of the current paths of them are connected to each other at a junction node. Between the junction node of the transistors and the ground, the transistor 152*c* and fuse 152*d* are connected. Signal LOWVDDn is supplied to the gates of the transistor 152*a* and transistor 152*c*. The junction node is connected via the inverter circuit 152*e* to one input end of the NOR circuit 152*g*. Command signal CMD_ROMBA is supplied via the inverter circuit 152*f* to the other input terminal of the NOR circuit 152*g*. The output terminal of the NOR circuit 152*g* is connected to the input terminal of the inverter circuit 152*h*. Signal ERAENABL is outputted from the output terminal of the inverter circuit 152*h*.

The signal LOWVDDn goes low temporarily when the power supply is turned on and thereafter is made high. Before the fuses 151*d*, 152*d* are blown, output signal PROENABL and output signal ERAENABL are always high, which enables both a program operation and an erase operation. However, after the fuses 151*d*, 152*d* are blown, when the command signal CMD_ROMBA for accessing the ROM block goes high, both of the output signals PROENABL, ERAENABL go low, which prevents the ROM block from being written into or erased from. The blowing of the fuse 151*d* or 152*d* can be set arbitrarily.

(Operation in Quadrual Data)

With the semiconductor memory device of the present invention, the operation in quadrual data will be explained.

Figure 16:
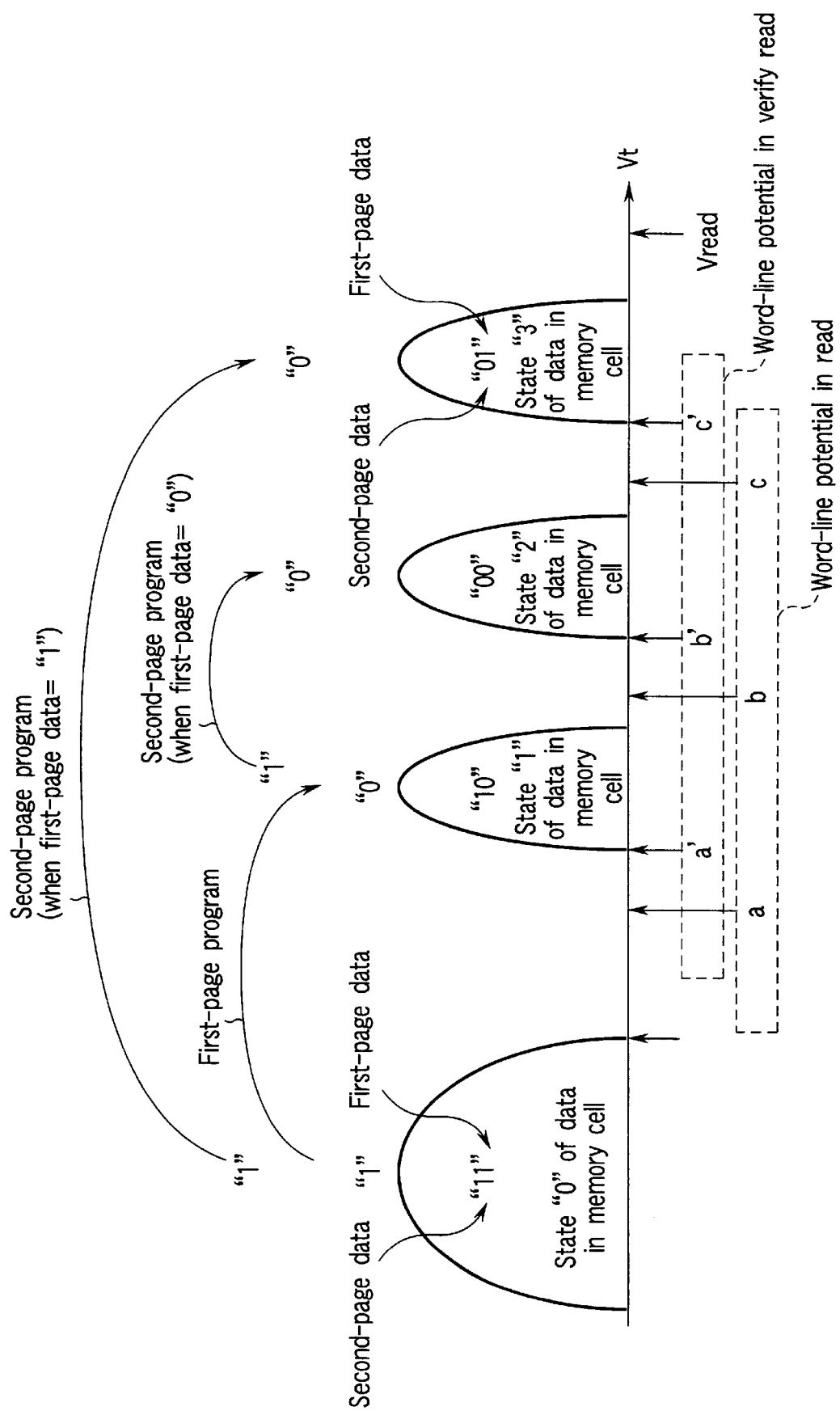
FIG. 16 shows a method of writing quadrual data.

The data in a memory cell and the threshold value of the memory cell are defined as shown in FIGS. 16 and 17A. Here, the states "0" to "3" of the data in a memory cell have been defined in ascending order, from the lowest to the highest threshold value. When erasing is done, the data in a memory cell goes to state "0." According to the write operation, the threshold voltage of the memory cell shifts toward a higher one.

FIG. 16 shows a writing method according to the present invention. When the data is written into a memory cell, the data on the first page is first written into memory cells and then the data on the second page is written into memory cells. When the writing data constituting the data on the first page or second page is "1," the threshold voltage of the memory cells do not change according to the write operation, with the result that the data in the memory cells remains unchanged. That is, no data is written into the memory cells. When the writing data constituting the data on the first page or second page is "0," the threshold voltage of the memory cells is changed as a result of the write operation, with the result that the data in the memory cells is also changed. That is, the data is written into the memory cells.

The data in a memory cell in the erased state is in state "0." In this state, the data on the first page is first written into the memory cells. When the writing data is "1," the data in the memory cells into which no data has not been written remain in state "0." When the writing data is "0," the data in the memory cells into which the data has been written is brought into state "1."

Next, the data on the second page is written into the memory cells. At this time, when the writing data "0" is supplied to the memory cells whose data is in state "1" in the first-page write operation, the data in the memory cells is brought into state "2." When the writing data "0" is supplied to the memory cells whose data is in state "0" in the first-page write operation, the data in the memory cells go to state "3."

When the writing data "1" is externally supplied to the memory cells whose data is in state "1" in the first-page write operation, the data in the memory cells is allowed to remain in state "1." When the writing data "1" is externally supplied to the memory cells whose data is in state "0" in the first-page write operation, the data in the memory cells is allowed to remain in state "0."

In the present invention, when the data in the memory cells is in state "2," the data on the first page and second page is set to "0," "0" as shown in FIGS. 16 and 17A. When the data in the memory cells is in state "3," the data on the first and second page is set to "1," "0." When the data in the memory cells is read, the data on the second page is first read and then the data on the first page is read.

In a case where the data on the second page is read, when the data in the memory cells is in state "0" or state "1," the read data is "1." When the data in the memory cells is in state "2" or state "3," the read data is "0." Therefore, the reading of the data on the second page can be judged in only one operation that determines whether the data in the memory cells is in state "1" or less or in state "2" or more.

On the other hand, in a case where the data on the first page is read, when the data in the memory cells is in state "0" or state "3," the read data is "1." When the data in the memory cells is in state "1" or state "2," the read data is "0." Therefore, the data on the first page can be read on the basis of the judgment whether the data in the memory cells is in state "0" or state "1" or more and the judgment whether the data in the memory cells is in state "2" or less or state "3." That is, the data on the first page can be read in a total of two operations.

After an erase operation is carried out, the data in the memory cells goes to state "0." Even when any of the first and second pages is specified in an address, the read data is "1."

Switching between the two bits (the first and second pages) is done by address A9. For example, when address A9 is made low, this specifies the first page. When address A9 is made high, this specifies the second page.

In the case of a multivalued memory, the threshold voltage of the memory cells must be controlled accurately according to the writing data. Therefore, when the data is written into the memory cells, the voltage applied to the control gates of the memory cells is increased gradually. Such a writing method is called a step-up writing method.

Figure 18:
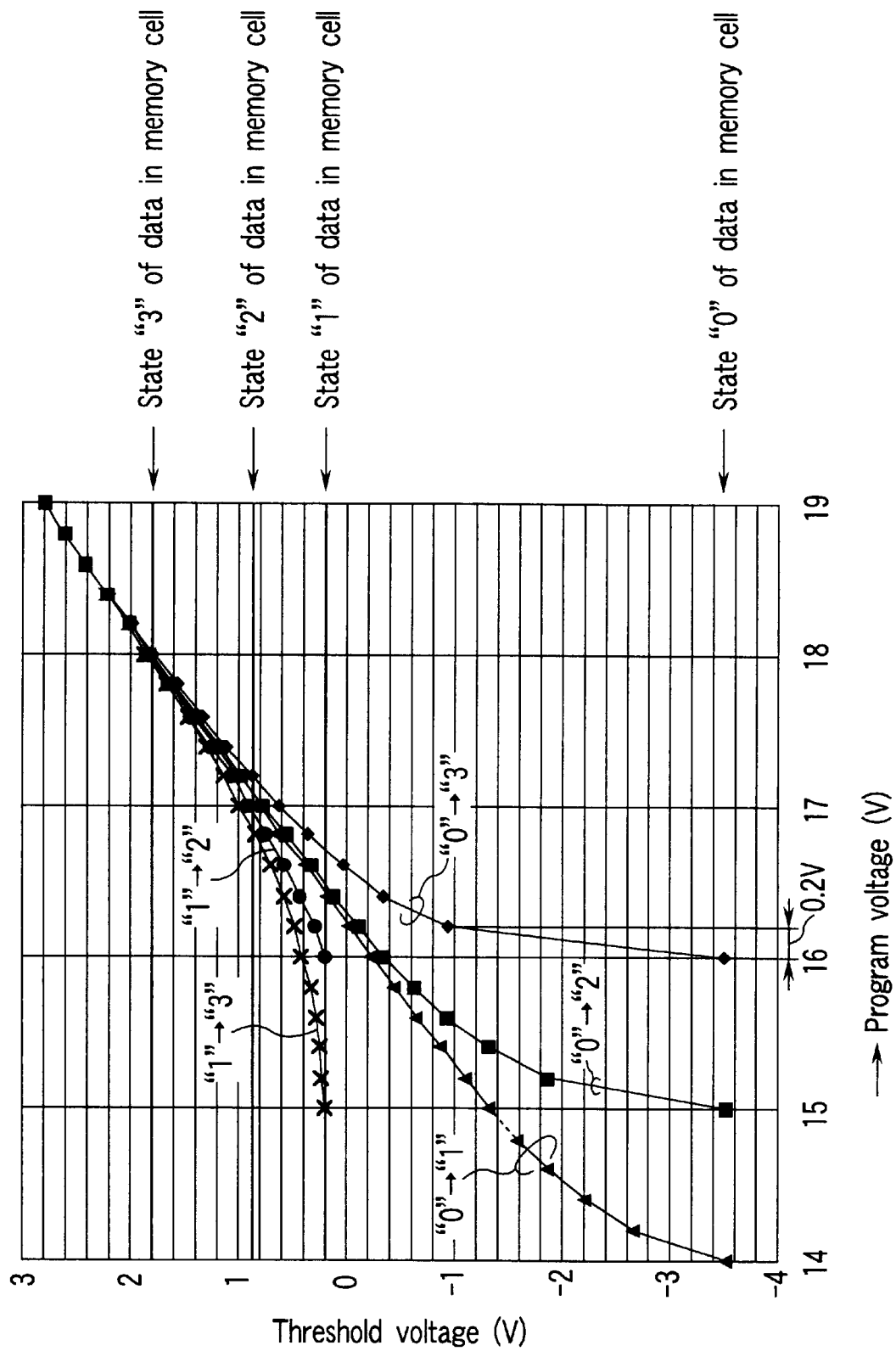
FIG. 18 is a writing characteristic diagram for the step-up writing method.

FIG. 18 shows a writing characteristic of the step-up writing method for the memory cells. The threshold voltage of a cell is shown on the ordinate axis and the write voltage (or program voltage) is shown on the abscissa axis.

The threshold voltage of a cell after erasing (the data in a memory cell is in state "0") is set at, for example, −3.5 V. As described above, when the data in a memory cell is changed from state "0" to state "3," an initial program voltage of 16 V is applied to the control gate of the cell. Thereafter, when writing is done, while the write voltage is being increased in 0.2 V increment, the threshold voltage rises along the curve "0"→"3" in the figure. On the other hand, when the data in the memory cell is changed from state "0" to state "1," writing is started with an initial write voltage of 14 V. The reason is that the threshold voltage of state "1" is 0.2 V. Therefore, when writing is started with the 16 V initial write voltage, the data reaches the threshold voltage of state "1" between the third step and fourth step, which might result in overprogram. To avoid this, the initial write voltage is set at 14 V.

In the first-page write operation, the data in the memory cell changes from state "0" to state "1." Therefore, after writing is done 13 times, the data in the memory cell has reached state "1." In the second-page write operation, the data in the memory cell is changed as follows: state "0" to state "3" or "0"→"3" and state "1" to state "2" or "1"→"2." At this time, the reason why the state is changed as "0"→"3" is that, because writing is done above "0"→"1," the initial write voltage can be raised to 16 V.

Therefore, as shown in FIG. 17B, when the data in the memory cell is changed from state "0" to state "3," the number of writes is 11. When the data in the memory cell is changed from state "1" to state "2," the number of writes is 6. Thus, in the second-page write operation, programming can be done in 11 writes. As a result, the total number of writes on the first and second pages is 24.

On the other hand, when the data is written simultaneously on the first and second pages, the state of the data in the memory cell is changed in this order: "0"→"1," "0"→"2," "0"→"3." For this reason, the initial write voltage is set at 14 V.

Therefore, as shown in FIG. 17C, when the data in the memory cell is changed from state "0" to state "1," the number of writes is 13. When the data in the memory cell is changed from state "0" to state "2," the number of writes is 17. When the data in the memory cell is changed from state "0" to state "3," the number of writes is 20. Thus, when the data is written on the first and second page simultaneously, writing has been completed in 20 writes. Therefore, when the first and second pages are written into simultaneously, the data can be written at high speeds.

Furthermore, since the first and second pages are within the same block, the two consecutive pages can be written into at high speeds.

(Autoprogram)

In a program operation, the data input command "80h" (h means a hexadecimal number) is first inputted as shown in FIG. 19, thereby setting data "1" (no writing is to be done) in the first latch circuits LAT(A) of all the data storage circuits $31_0$ to $31_{n/2}$. Thereafter, an address and data are inputted according to the signal ALE and the toggling of the signal WE. As a result, the data is supplied serially to the data storage circuit specified by the column address.

When the externally inputted data is data "1" indicating that no writing is to be done, the node NC of the data storage circuit of FIG. 5 goes high. When the externally inputted data is data "0" indicating that writing is to be done, the node NC goes low. From this time on, the data in the first latch circuit LAT(A) is assumed to be at the potential of the node NC.

Then, the autoprogram execute command "10h" is inputted as shown in FIG. 19, thereby starting the autoprogram. When ECC code is used, the ECC code generating circuit 8 creates an ECC code automatically after the input of the command "10h," and supplies the code to the data storage circuit. Thereafter, the autoprogram operation is started.

As shown in FIG. 20, in a double-speed program operation, after the data input command "80h," address, and data are inputted, the command "11h" is inputted to output a dummy Busy signal. This dummy program outputs a Busy signal for as short a time as 15 $\mu$s. When ECC code is used, an ECC code is generated after the input of the command "11h." The code is supplied to the data storage circuit. Therefore, the duration of the Busy signal is longer than 1.5 $\mu$s.

The command "80h," address, data, and command "11h" are inputted four times, while the array address (A15, A16) is changed each time. Only in the last time, the command "10h" is inputted in place of the command "11h," thereby executing the autoprogram. In the command "80h" in the second time or later, the first latch circuit LAT(A) is not reset.

A given block address (A17 to A26) is inputted each time. In the row address register 18 of FIG. 1, however, when the next address is inputted, the preceding address disappears. For this reason, each time a block address is inputted, the array block latch circuit 19 of FIG. 1 latches the block address for each array.

Figure 22:
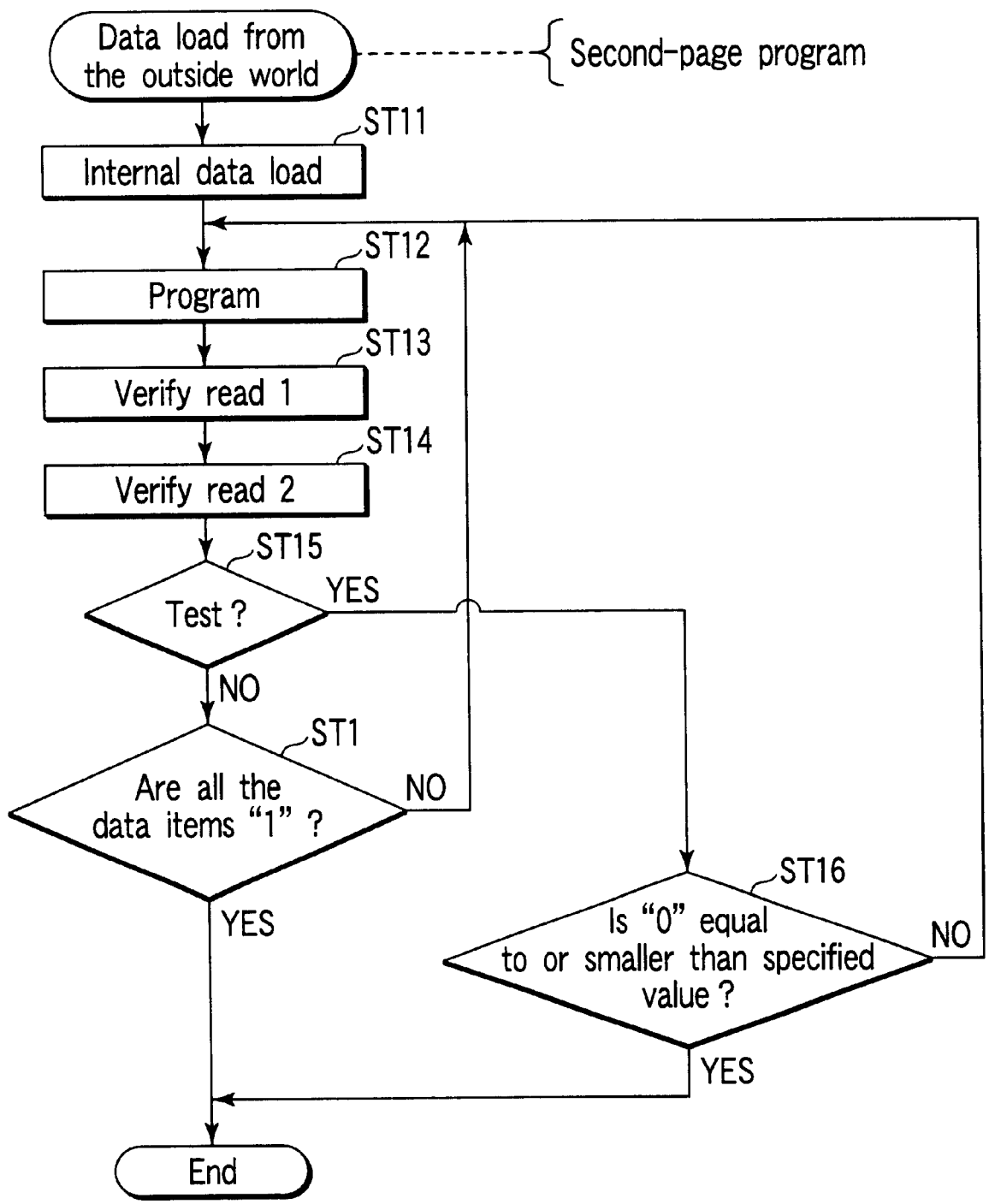
FIG. 22 is a flowchart for the first-page program operation.

After the autoprogram command "10h" is inputted, a program operation is performed. Since the present memory is a multivalued memory, two bits of data are stored in a memory cell. The two bits are allocated to address A9 as described above. Specifically, when address A9 is low, the first page is specified. When address A9 is high, the second page is specified. The first-page writing sequence and second-page writing sequence are shown in FIGS. 21 and 22, respectively. With the present memory, the data on the first page is first written and then the data on the second page is written. Using FIGS. 21 and 22, the first-page program and the second-page program will be explained briefly.

In the first-page program of FIG. 21, the data set in the individual data storage circuits $31_0$ to $31_{n/2}$ is programmed in the memory cells (ST1). Thereafter, a verify read is executed to see if writing is sufficient (ST2). Specifically, the data in the memory cells is read and latched in the first latch circuit LAT(A) of each data storage circuit. Thereafter, in the test process before a faulty block is replaced with a block redundancy, the number of low level data items latched in the first latch circuits LAT(A), or the number of verify files, is counted. The count value is equal to or larger than a specified value (in the embodiment, when there are four column redundancies, the specified value is 4, and when there are eight column redundancies, the specified value is 8), the program verify is repeated again. When the count value is smaller than the specified value, the program operation is terminated (ST4). In a case other than the test, it is judged whether the data latched in each first latch circuit LAT(A) is "1" (ST5). If the result has shown that all of the data items latched in the individual first latch circuits LAT(A) are not "1," the above operation is repeated. If the result has shown that all of the data items are "1," the first-page program is completed.

On the other hand, in the second-page program shown in FIG. 22, internal data loading is first done (ST11). In the internal data loading, after the data is set in the first latch circuit LAT(A) of each of the individual data storage circuits $31_0$ to $31_{n/2}$, the data written in the first-page program is read into the second latch circuit LAT(B) of each data storage circuit. Thereafter, programming is done as in the first page (ST12). Next, in a verify read 1, it is verified whether the data in the memory cell is in state "2" (ST13). In addition, in a verify read 2, it is verified whether the data in the memory cell is in state "3" (ST14). From this time on, the same operation as in the first-page program is carried out (ST15 to ST17).

In the faulty block of the partially good product, the fuse 109 has been blown after the test. Therefore, when the faulty block is accessed, the faulty block is not selected. As a result, "verify OK" is given, which completes the operation.

Next, the first-page and second-page programs will be explained in detail. In the explanation, step ST3 and step ST4 in FIG. 21 and step ST15 and step ST16 in FIG. 22 will be omitted.

(First-Page Autoprogram)

FIG. 23 shows a sequence for the operation of each section during the first-page program. As shown in FIGS. 5 and 23, signal BLC1 supplied to the gate of the transistor 61$h$ in the data storage circuit is set to VCC+Vth, signal BLSA to Vpass, and signal BLTR to VCC. Then, when data "1" (no writing is to be done) has been stored in the first latch circuit LAT(A), the potential on the bit line BL goes to VCC. When data "0" (writing is to be done) has been stored in the first latch circuit LAT(A), the potential on the bit line goes to the ground potential VSS. The cells that are connected to the selected word line and belong to the unselected page (whose bit lines are not selected) must not be written into. The potential on the bit lines connected to these cells is set to the potential VCC as are the bit lines to which data "1" is supplied.

Here, the CG driving circuit 9 of FIG. 1 applies VCC to the select line SG1, VSS to the select line SG2, VPGM (20 V) to the select CG line, and Vpass (10 V) to the unselected word lines. Then, the select line SG1 in the block (in double speed, each array has such a block) selected by the block select circuit 6 goes to VCC, the select word line to VPGM (20 V), and the unselected word lines to VPASS (10 V). When the bit line is at VSS, the channel of the cell is at VSS and the word line is at VPGM. As a result, the cell is programmed. On the other hand, when the bit line is at VCC, the channel of the cell is raised to VPGM, not VSS, the channel is set at VPGM/2 through charge coupling. Therefore, the cell is not programmed.

In this way, the memory cell into which data "0" is written goes to state "1" as shown in FIGS. 16 and 17A. The memory cell into which data "1" is written remains in state "0."

(First-Page Program Verify)

Next, a program verify read is executed (ST2 in FIG. 21).

Figure 25:
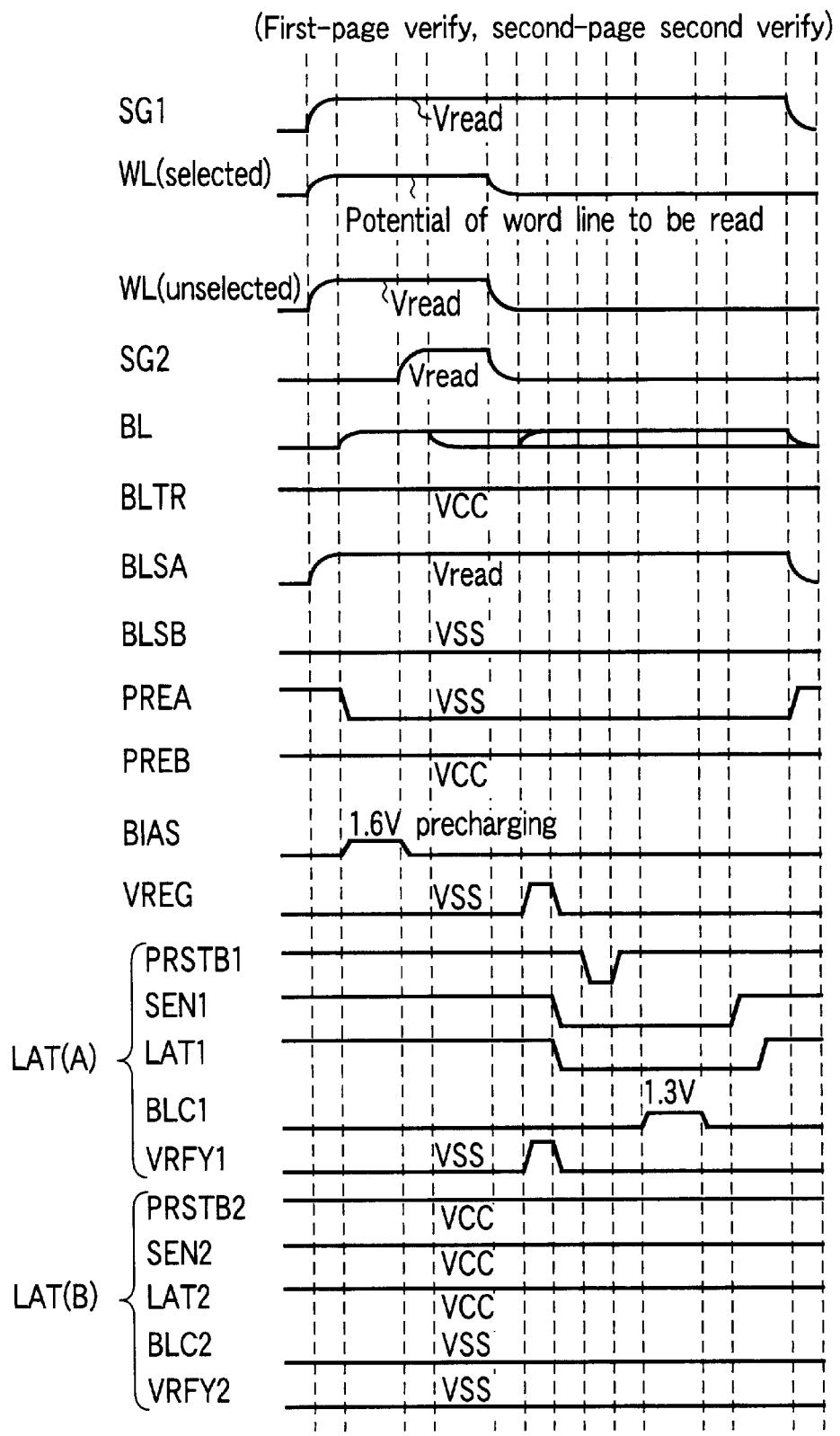
FIG. 25 is a waveform diagram showing the sequence of a program verify read.

FIG. 24 shows the operation of a program verify read. FIG. 25 shows the sequence of each section in the program verify read.

In the first-page program verify read, a potential b' higher than a potential b in reading is supplied to the selected word line as shown in FIG. 16. Hereinafter, let "'" indicate a verify potential a little higher than the word line potential in reading.

Next, as shown in FIG. 25, voltage Vread is supplied to the unselected word lines and the select line SG1 in the selected block. Signal BIAS supplied to the gate of the transistor 61$g$ in the data storage circuit of FIG. 5 is made high (1.6 V), thereby precharging the bit line.

Thereafter, the select line SG2 on the source side of the memory cell is made high (Vread). Since the memory cell turns off when the threshold voltage of the memory cell is higher than the potential b', the bit line remains high. When the threshold voltage of the memory cell has not reached the potential b', the memory cell turns on, making the potential on the bit line low (VSS).

Here, when writing is done, the low level (data "0") is latched at the node NA of the first latch circuit LAT(A) of FIG. 5. When no writing is done, the high level (data "1") is latched at the node NA. For this reason, when signal VREG supplied to the current path of the transistor 611 is set to VCC and signal VREY1 supplied to the gate is made high, the bit line is changed from the floating level to the high level and fixed there only when no writing is done. After this operation, the potential on the bit line is read into the first latch circuit LAT(A). It is when the potential of the memory cell has reached the threshold voltage, or when no writing is done, that the high level is latched in the first latch circuit LAT(A). In addition, it is when the potential of the memory cells has not reached the threshold voltage that the low level is latched in the first latch circuit LAT(A).

Therefore, when the first latch circuit LAT(A) is at the low level, writing is done again and the program operation and verify read operation are repeated until the data in all the data storage circuits goes high a (FIG. 21 and ST1 to ST5).

(Second-Page Program)

In the second-page program, as in the first-page program, the data on the second page is externally supplied. The data is stored in the first latch circuit LAT(A) of each of the data storage circuits $31_0$ to $31_{n/2}$.

The operation of the second-page program differs greatly from the operation of the first-page program in internal data loading (ST11). The operation of the second-page program varies according to the result of the operation of the first-page program.

Specifically, as shown in FIGS. 16 and 17A, in a case where the data in the first-page memory cell is in state "0" (no writing has been done), when the data on the second page is "0" (writing is to be done), the data in the memory cells is set to state "3." When the data on the second page is "1" (no writing is to be done), the data in the memory cells is allowed to remain in state "0." In a case where the data in the memory cells is in state "1" (the first page has been written into), when the data on the second page is "0" (writing is to be done), the data in the memory cells is set to state "2." When the data on the second page is "1" (no writing is to be done), the data in the memory cell is allowed to remain in state "1."

As described above, the operation of the second page varies according to the result of the operation of the first-page program. For this reason, before the data on the second page is written into the cells, it is necessary to check whether the data in the memory cells is in state "0," or "1" and store the checked state. To achieve this, internal data loading is done (ST11). In the internal data loading, the data in the memory cells is read and loaded into the second latch circuit LAT(B) of each data storage circuit in FIG. 5. Furthermore, in the internal data loading, the potential a in FIG. 16 is supplied to the word lines, thereby performing a read operation. The result of the reading is stored in the second latch circuit LAT(B) of each data storage circuit.

Figure 27:
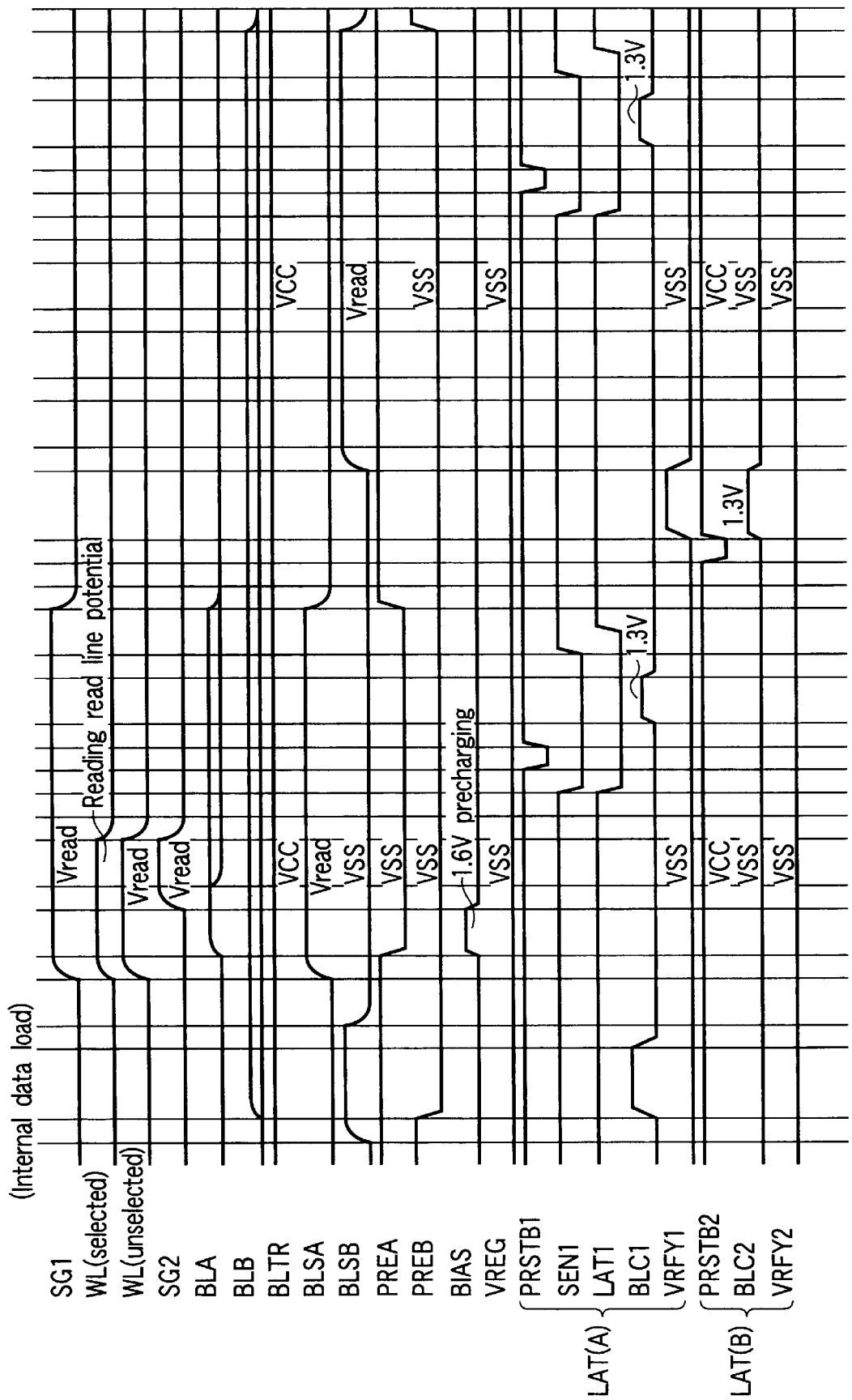
FIG. 27 is a waveform diagram showing the sequence during an internal data load operation.

FIG. 26A is a table showing the operation in internal data loading. FIG. 27 shows the sequence of each section in internal data loading. The operation of internal data loading will be explained by reference to FIGS. 26A and 27.

In internal data loading, the unselected bit line is caused to store the data in the first latch circuit LAT(A) of the data storage circuit in FIG. 5. Then, the potential a is applied to the word line, thereby carrying out a read operation. The result of the read operation is stored in the first latch circuit LAT(A). When the data in the memory cell is "0," data "0" is latched in the first latch circuit LAT(A). When the data in the memory cell is "1," data "1" is stored in the first latch circuit LAT(A).

Next, after the data in the second latch circuit LAT(B) is made "1," an intermediate voltage of 1 V is applied to signal BLC2, signal VREG is set to the voltage VSS, and signal VRFY1 is made high. Then, when the data in the first latch circuit LAT(A) is "1," that is, the data in the memory cell is "1," the data in the second latch circuit LAT(B) becomes "0." When the data in the first latch circuit LAT(A) is "0," that is, the data in the memory cell is in state "1," the data in the second latch circuit LAT(B) remains at "1." Thereafter, the data stored in the unselected bit line is returned to the first latch circuit LAT(A).

Next, as in the first-page program, a specific voltage is applied to each section. In this state, all the selected cells are written into according to the data on the second page stored in the first latch circuits LAT(A) (ST12 in FIG. 22).

(Second-Page Verify)

A second-page verify includes a first verify read (ST13) and a second verify read (ST14). In the first verify read (ST13), it is verified whether the data in the memory cell is in state "2." In the second verify read (ST14), it is verified whether the data in the memory cell is in state "3."

{Second-Page First Verify Read}

Figure 28:
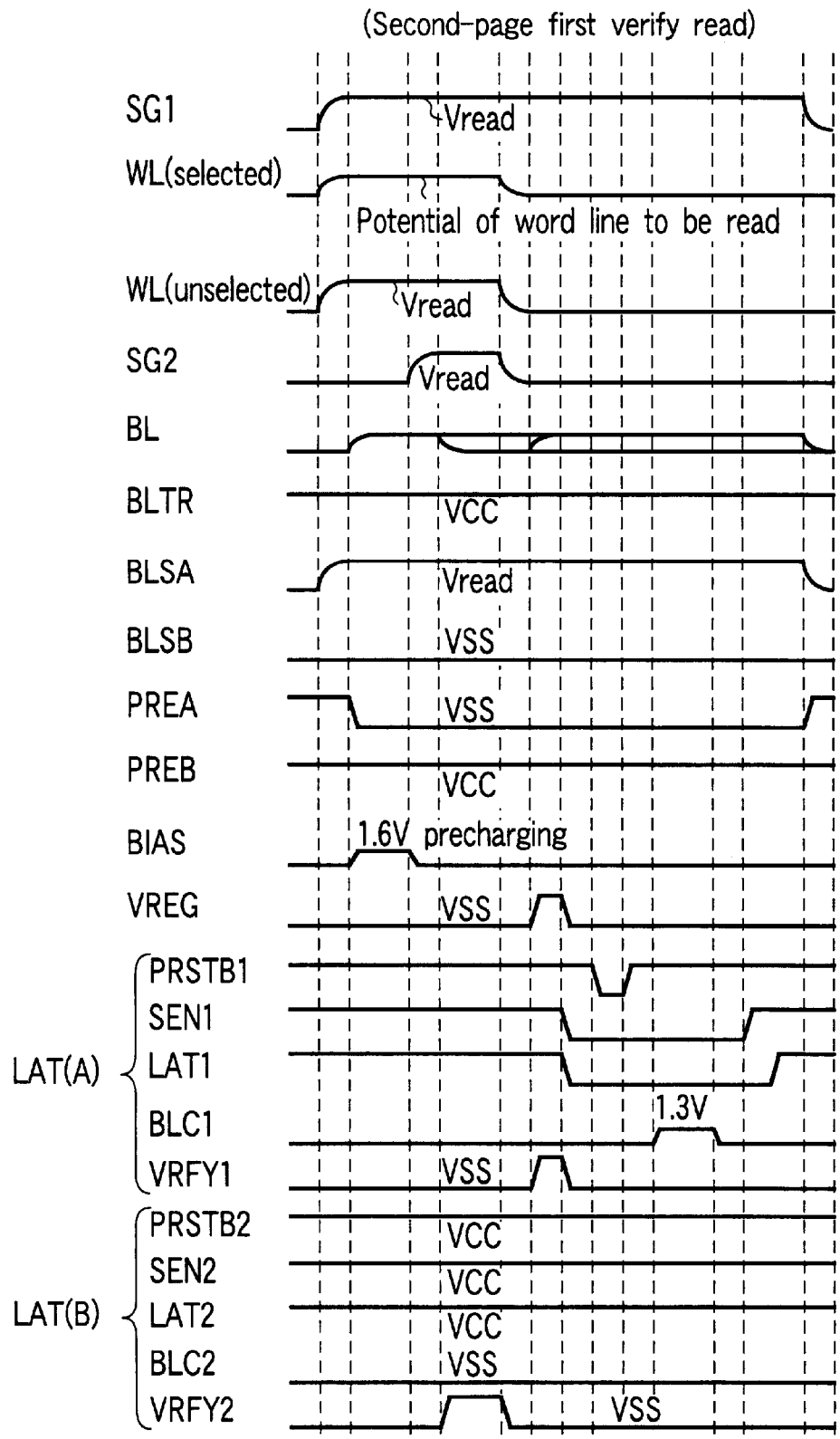
FIG. 28 is a waveform diagram showing the sequence during the second-page first verify read.

FIG. 26B is a table showing the operation of a second-page first verify read. FIG. 28 shows the sequence of each section in the second-page first verify read.

In the verify, the potential b' is applied to the word line, thereby performing a read operation as shown in FIG. 16. As a result, when the threshold voltage of the memory cell has reached b', the bit line goes high. When the threshold voltage of the memory cell has not reached b', the bit line goes low. At this time, the cell that brings the data in the memory cell into state "3" is also turned off. As a result, "verify OK" is given. Then, the potential on the bit line connected to the memory cell whose data is in state "0" without being written in the first-page writing operation is made low.

Specifically, when the data in the memory cell is in state "0" without being written during the first-page writing operation, the node ND of the second latch circuit LAT(B) is made high in the internal data loading. In this state, the signal VREG supplied to the current path of the transistor 61u of FIG. 5 is set to the ground voltage VSS as shown in FIG. 28 and the signal VRFY2 supplied to the gate is made high. Then, when the node ND of the second latch circuit LAT(B) is high, the transistor 61t turns on, forcing the bit line low.

Next, as in the first-page verify operation, the signal VREG is set to the power-supply voltage VCC and the signal VRFY1 supplied to the gate of the transistor 611 is made high. Then, when the high level is latched at the node NC of the first latch circuit LAT(A) (or when no writing is to be done), the transistor 61k turns on. As a result, the bit line goes high. After the operation, the potential on the bit line is read into the first latch circuit LAT(A).

It is when the cell being written into to bring the data in the memory cell into state "2" has reached the threshold voltage or when no writing is to be done as shown in FIG. 26B that the high level is latched in the first latch circuit LAT(A). Moreover, it is when the cell being written into to bring the data in the memory cell into state "2" has not reached the threshold voltage or when the data in the memory cell being written into is in state "3" that the low level is latched in the first latch circuit LAT(A).

{Second-Page Second Verify Read}

FIG. 26C is a table showing the second-page second verify read operation. FIG. 25 shows the sequence for each section in the second-page second verify read operation.

This verify is completely the same as the first-page verify operation. The reason is that cells whose potential is higher than the potential c' in FIG. 16 do not exist except for the cell that brings the data into state "3." In the first-page verify operation, the potential a' has been applied to the word line to verify whether the data in the memory cell has become state "1." In the present case, however, the potential c' is applied to the word line to verify whether the data in the memory cell has become state "3."

As a result, it is when the cell has reached the threshold voltage or when no writing is to be done (the high level has been latched in the first latch circuit LAT(A)) as shown in FIG. 26C that the high level is latched in the first latch circuit LAT(A). In addition, it is when the cell has not reached the threshold voltage, that is, the data in the memory cell has not reached state "3" (NG), although writing is being done to bring the data in the memory cell into state "3," or when the data in memory cell is being brought into state "2" that the low level is latched in the first latch circuit LAT(A).

Therefore, in the second-page verify operation, the first verify read and second verify read are carried out. The first verify read is performed when the data in the memory cell is brought into state "2." The second verify read is performed when the data in the memory cell is brought into state "3." In addition, when the first latch circuit LAT(A) is at the low level, the write operation is carried out again. In this way, the program operation and verify operation are repeated until the data in all the data storage circuits go high (ST12 to ST17 in FIG. 22).

When the data in the memory cell is in state "3," the threshold voltage is high. For this reason, it is difficult to write the data into this memory cell. For this reason, of the repeated program verify operations, the operation of verifying whether the data in the memory cell has reached state "3" can be omitted the first several times. After the verify operation has been repeated several times, the memory cell into which data on state "2" whose threshold voltage is lower than that of state "3" is written should have completed the writing. For this reason, the memory cell into which data on state "2" is written can omit the verify after the program verify file operation has been repeated several times.

(Read Operation)

FIG. 29 shows the sequence of a read operation.

A read operation is started by inputting the read command "00h" and an address as shown in FIG. 29. In the read operation, the data in all the cells on the page specified by the address are read into the data storage circuits $31_0$ to $31_{n/2}$. Thereafter, when the signal BUSY is canceled and returns to the ready state, the data storage circuit outputs the data according to the toggling of the signal RE in the order specified by the column address.

Figure 30:
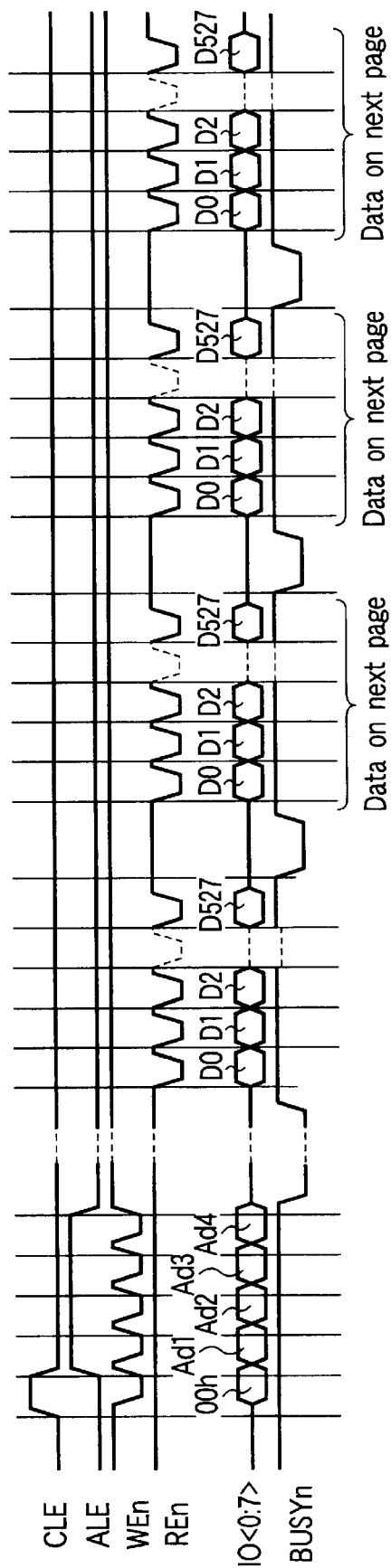
FIG. 30 is a waveform diagram showing the sequence for a double-speed read operation.

FIG. 30 shows the sequence for a double-speed read operation. In the double-speed read, the data in all the cells on the pages in the four memory cell arrays is read into each data storage circuit in one read operation. Thereafter, when the signal BUSY is canceled and returns to the ready state, the data storage circuits output the data according to the toggle of the signal RE in the order specified by the column address. When the last column address in one memory cell array has been reached, a short signal BUSY (1.5 µs) is outputted. Thereafter, when the signal BUSY is canceled and returns to the ready state, the data in the next memory cell array is outputted according to the toggling of the signal RE. Such operations are repeated, thereby outputting four pages of data sequentially in one read operation. Since the four pages are not consecutive, it is necessary to assign addresses to them as shown in FIGS. 6C and 6D.

The memory of the first embodiment is a multivalued memory, where two bits of data are stored in one cell. The two bits of data are specified by address A9. That is, as described above, when address A9 is at the high level, the second page is specified. When address A9 is at the low level, the first page is specified.

FIG. 31 is a flowchart schematically showing a read operation.

A read operation is started by inputting the read command "00h" and then inputting an address (ST21). When address A9 is high, the data on the second page is read (ST25). In the second-page read, it is judged whether the data in the memory cells is equal to "2" or less as shown in FIGS. 16 and 17.

Next, when address A9 is low, the data on the first page is read. The first-page read operation includes two read operations. In a first read operation (first-page read 1) (ST22), it is judged whether the data in the memory cells is equal to "2" or less or equal to "3" as shown in FIGS. 16 and 17A. In a second read operation (first-page read 2) (ST24), it is judged whether the data in the memory cell is equal to "1" or equal to "2" or more as shown in FIGS. 16 and 17A.

The fuse 109 of the block select circuit corresponding to the faulty block of the partially good product has been blown. As a result, when the faulty block is accessed in reading the binary second page or quadrual second page, the faulty block is not selected and therefore no current flows. For this reason, data "0" is outputted automatically. However, the first page is read in the quadrual memory, data "1" is outputted as a result of the first and second read operations (the first-page reads 1 and 2). From the signal FUSECUT outputted from the inverter circuit 114 of FIG. 12, it is known whether the fuse 109 has been blown. When the fuse has been blown, only the first read operation (the first-page read 1) is carried out, the second read operation (the first-page read 2) is not carried out, and data "0" is outputted (ST23).

Next, the read operation will be described by reference to FIGS. 32 to 35.

(Second-Page Read)

In the second-page read, the potential c in reading is applied to the selected word line as shown in FIG. 16.

Figure 34:
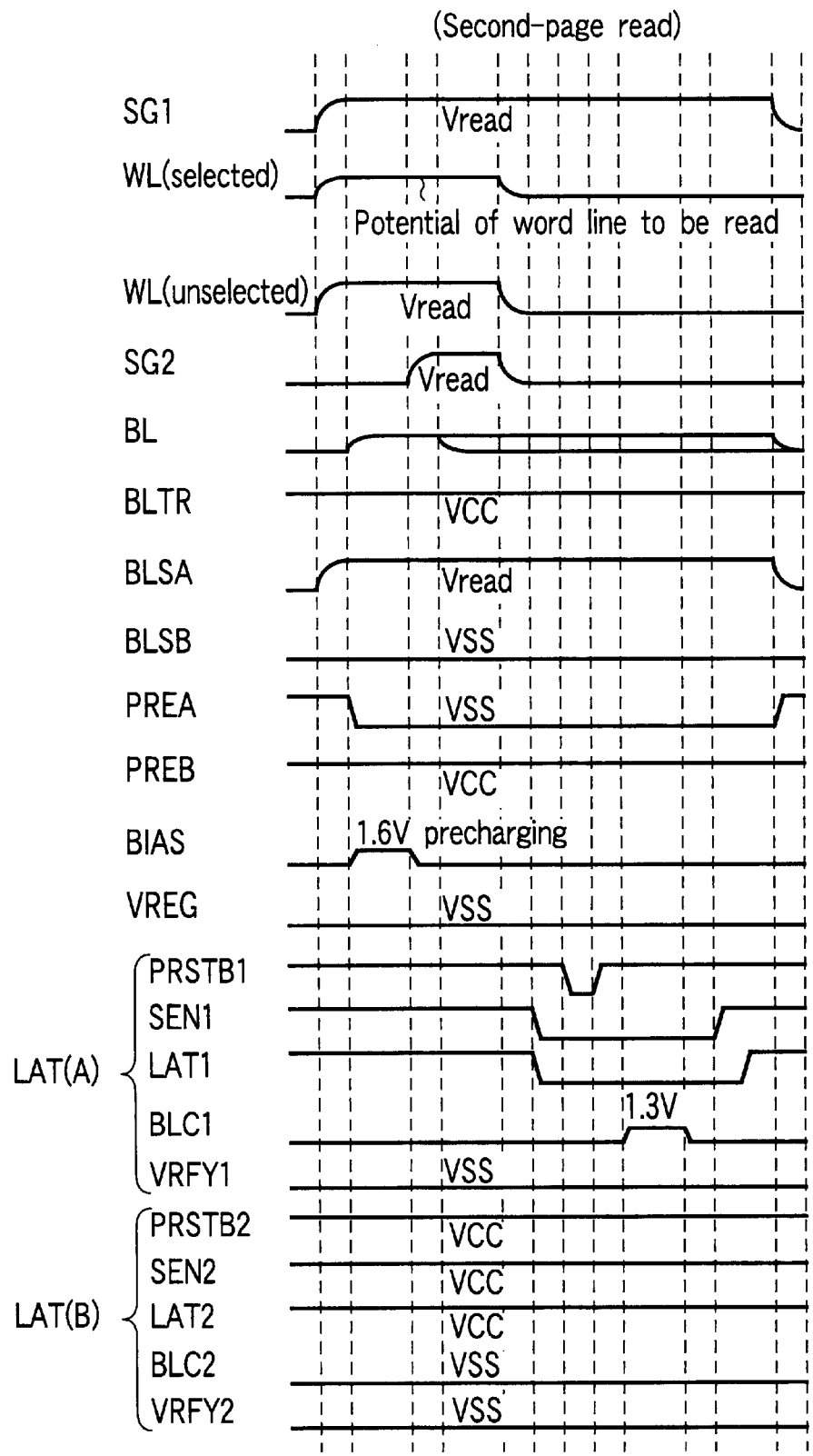
FIG. 34 is a waveform diagram showing the sequence for the second-page read operation.

Next, as shown in FIG. 34, Vread (4.5 V) is applied to the unselected word lines and select line SG1 in the selected block. The high BIAS is applied to the gate of the transistor 61g of the data storage circuit in FIG. 5, thereby precharging the bit line. Thereafter, the select line SG2 on the source side of the cell is made high. When the threshold voltage of the cells is higher than the potential c, the cells are turned off, which allows the bit line to remain high. When the threshold voltage of the cells has not reached the potential c, the cells are turned on, which causes the bit line to go to the ground potential VSS. The data in the memory cells and the threshold voltage of the memory cells have been defined as shown in FIG. 17A. Therefore, when the data in the memory cell is in state "0" or "1," the potential on the bit line goes low. When it is in state "2" or "3," the potential on the bit line goes high.

Then, the potential on the bit line is read into the first latch circuit LAT(A). When the data in the memory cell is in state "0" or "1," the node NA of the first latch circuit LAT(A) in FIG. 5 goes low. When it is in state "2" or "3," the node NA goes high. The node NB is at the opposite level to that of the node NA. When the column select line CSL is made high, the transistors 61o, 61n are turned on, causing the potentials at the nodes NB, NA to be outputted to the output buffer 4.

(First-Page Read)

Next, the data on the first page is read. When the data outputted in the first-page read is "1," the data in the memory cell is in state "0" or "3" as shown in FIG. 17A.

Therefore, it is judged whether the data in the memory cell is in state "2" or less or in state "3." Thereafter, it must be judged whether the data in the memory cell is in state "0" or in state "1" or more.

{First Read Operation}

Figure 35:
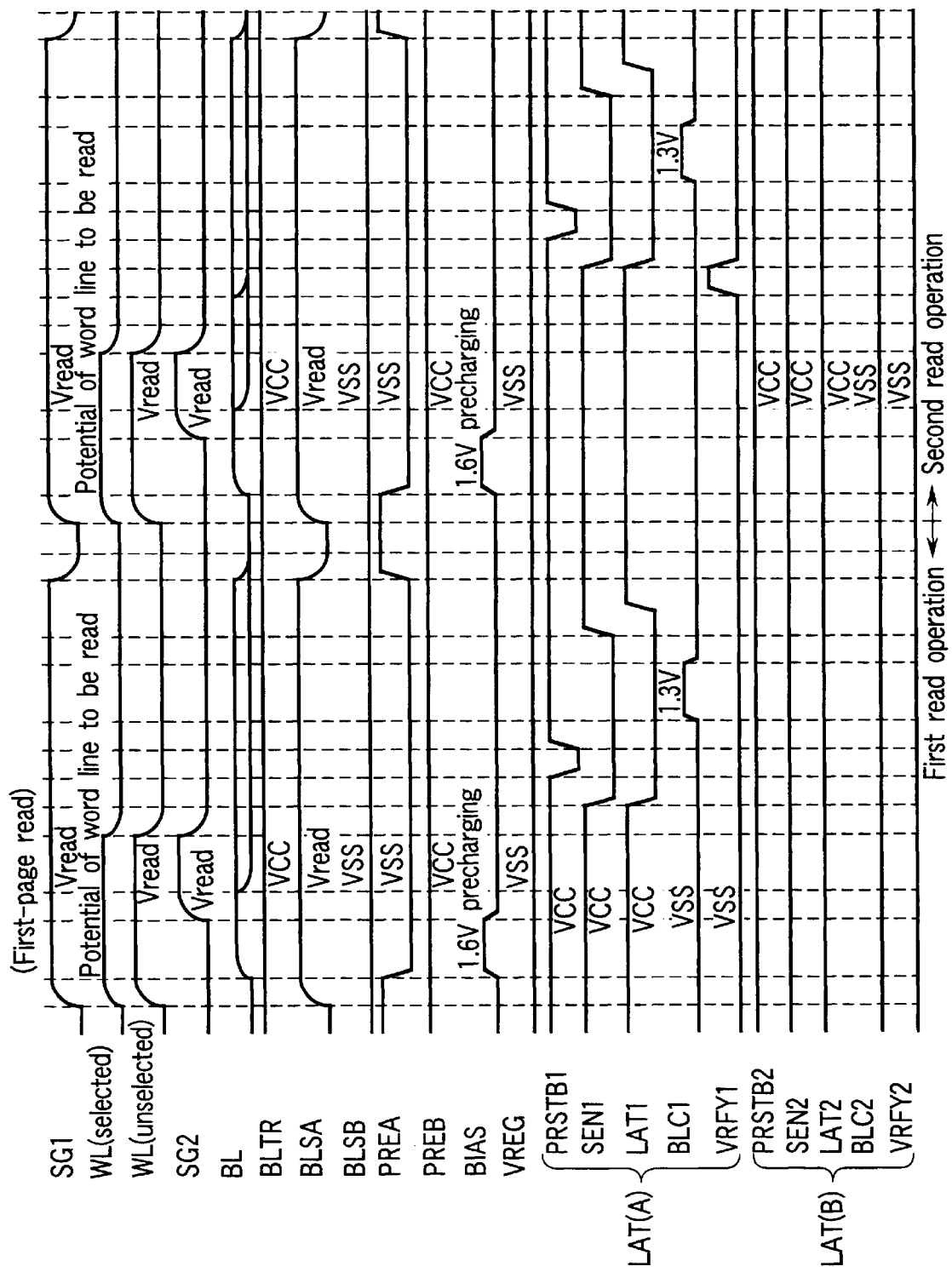
FIG. 35 is a waveform diagram showing the sequence for the second-page read operation.

In the first read operation, it is judged whether the data in the memory cell is in state "2" or less or in state "3." FIG. 33A is a table showing the first-page first read operation. The left half of FIG. 23 shows the sequence for the first-page first read operation. The sequence in FIG. 35 is the same as that of FIG. 34.

First, to check if the data in the memory cell is in state "2" or less or in state "3," the potential c is applied to the word line, thereby reading the data in the memory cell. As a result, it is only when the data in the memory cell is in state "3" as shown in FIG. 33A that the high level is latched in the first latch circuit LAT(A). Moreover, it is when the data in the memory cell is in any one of state "0," state "1," and state "2" that the low level is latched in the first latch circuit LAT(A).

{Second Read Operation}

Next, in the second read operation, it is judged whether the data in the memory cell is in state "0" or in state "1." FIG. 33B is a table showing the first-page second read operation. The right half of FIG. 35 shows the sequence for the first-page second read operation.

To check if the data in the memory cell is in state "0" or in state "1" or more, the potential a is applied to the word line, thereby reading the data in the memory cell. As a result, it is only when the data in the memory cell is in state "0" that the low level is latched in the first latch circuit LAT(A). Moreover, it is when the data in the memory cell is in any one of state "1," state "2," and state "3" that the high level is latched in the first latch circuit LAT(A).

Here, signal VREG in FIG. 5 is set at the ground potential VSS and signal VREFY1 supplied to the gate of the transistor 611 is made high. When the high level has been latched in the first latch circuit LAT(A), that is, when the data in the memory cell is in state "3" in the first-page first read operation, the bit line is forced to be low. As a result, when the data in the memory cell is in state "0" or "3," the potential on the bit line goes to the low level. Moreover, when the data in the memory cell is in state "1" or "2," the potential on the bit line goes to the high level.

Next, after the potential on the bit line has been read into the first latch circuit LAT(A), when the data in the memory cell is in state "0" or "3" as shown in FIG. 33B, the node NA of the first latch circuit LAT(A) goes low. In addition, when the data in the memory cell is in state "1" or "2," the node NA goes high. The node NB is at the opposite level to that of the node NA. When the column select line CSL is made high, the transistors 61o, 61n are turned on, causing the potentials at the node NB, NA to be outputted to the output buffer 4.

(Autoerase)

Figure 36:
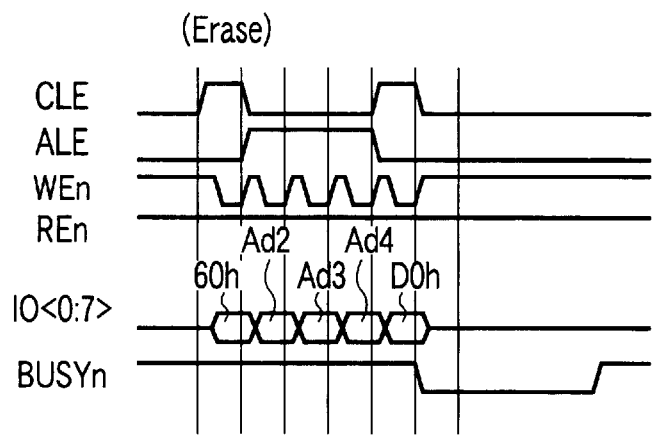
FIG. 36 is a waveform diagram showing the sequence for an erase operation.

FIG. 36 shows an erase operation. In an erase operation, erasing is done in blocks. To do this, the block select command "60h" for selecting a block is inputted and then a block address is inputted. Thereafter, when the autoerase execute command "Doh" is inputted, autoerase is started.

Figure 37:
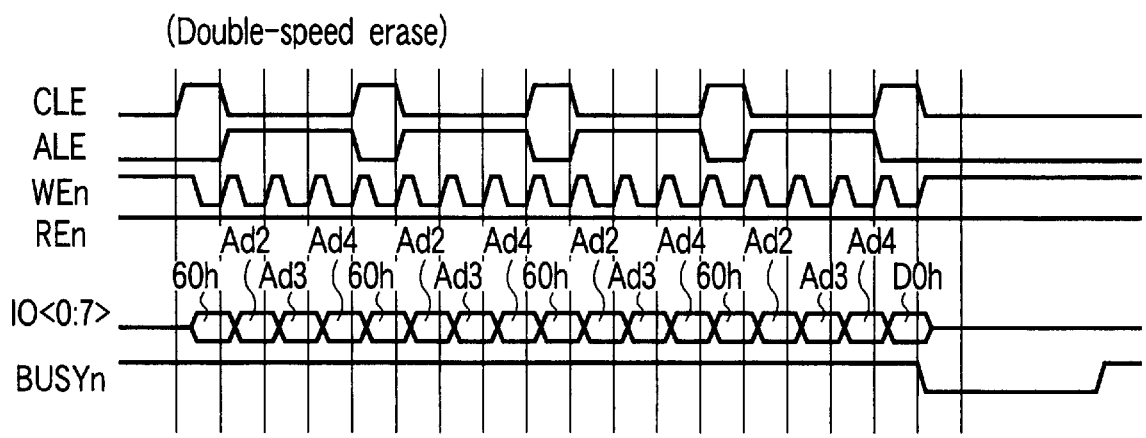
FIG. 37 is a waveform diagram showing the sequence for a double-speed erase operation.

FIG. 37 shows a double-speed erase operation. In a double-speed erase operation, the block select command "60h" and block address are inputted three times, while the array address (A15, A16) is changed each time. Thereafter, the block select command "60h," address, and autoerase execute command "D0h" are inputted, thereby starting a double-speed erase operation.

A given address is inputted as a block address (A17 to A26) each time. In the row address register 18 of FIG. 1, when the next address is inputted, the preceding address disappears. For this reason, each time an address is inputted, the array block latch circuit 19 of FIG. 1 latches the block address for each memory cell array.

Figure 38:
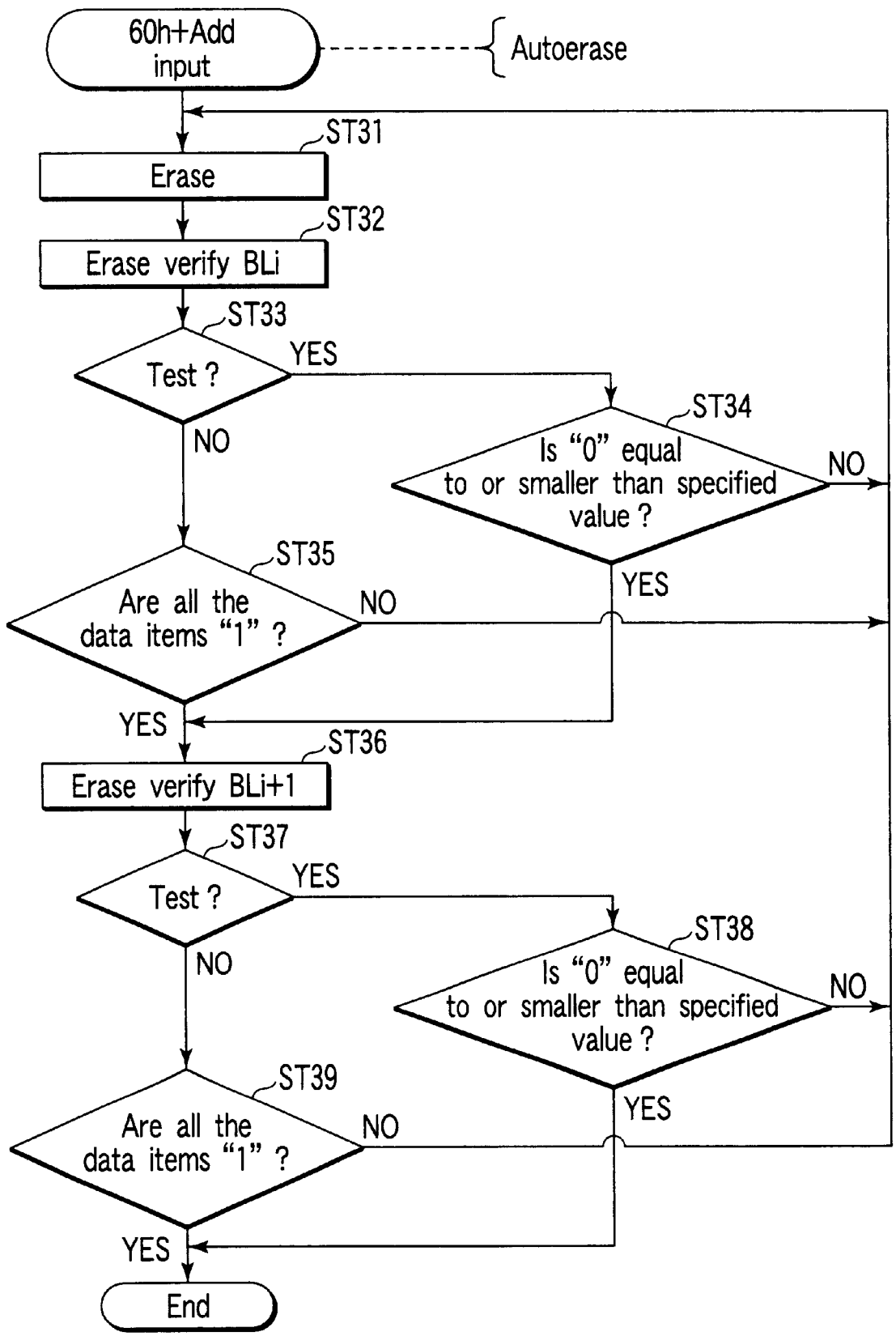
FIG. 38 is a flowchart schematically showing an autoerase operation.

FIG. 38 is a flowchart for autoerase. First, the erase operation of the selected block is carried out (ST31). Thereafter, of the two bit lines (BLi, BL+1) connected to the data storage circuit, one bit line (BLi) is subjected to an erase verify read operation. When the memory cell has not been erased sufficiently, erasing is done again (ST32 to ST35, ST31). When the memory cell has been erased sufficiently, the other bit line (BLi) is subjected to an erase verify read operation (ST36). As a result, when the memory cell has not been erased sufficiently, erasing is done again (ST36 to ST39, ST31). When the memory cell has been erased sufficiently, the operation is terminated.

In the test process before the faulty block is replaced with a block redundancy, the number of low-level data items latched in the first latch circuit LAT(A), that is, the number of verify files, is counted after the erase verify operations ST33, ST36. When the count value is equal to or larger than a specified value (in this embodiment, when there are four column redundancies, the specified value is 4; and when there are eight column redundancies, the specified value is 8), erasing is done again (ST34, ST38).

In the faulty block of the partially good product, the fuse 109 has been blown after the test. Therefore, when the faulty block is accessed, it is not selected. As a result, the data in the first latch circuit LAT(A) is at the low level, which prevents the erase verify from being OK. However, from the signal FUSECUT outputted from the inverter circuit 114 of FIG. 12, it can be known whether the fuse 109 has been blown. Therefore, when the signal FUSECUT has shown that the fuse 109 has been blown, the verify is regarded as OK.

(Erase)

Figure 39:
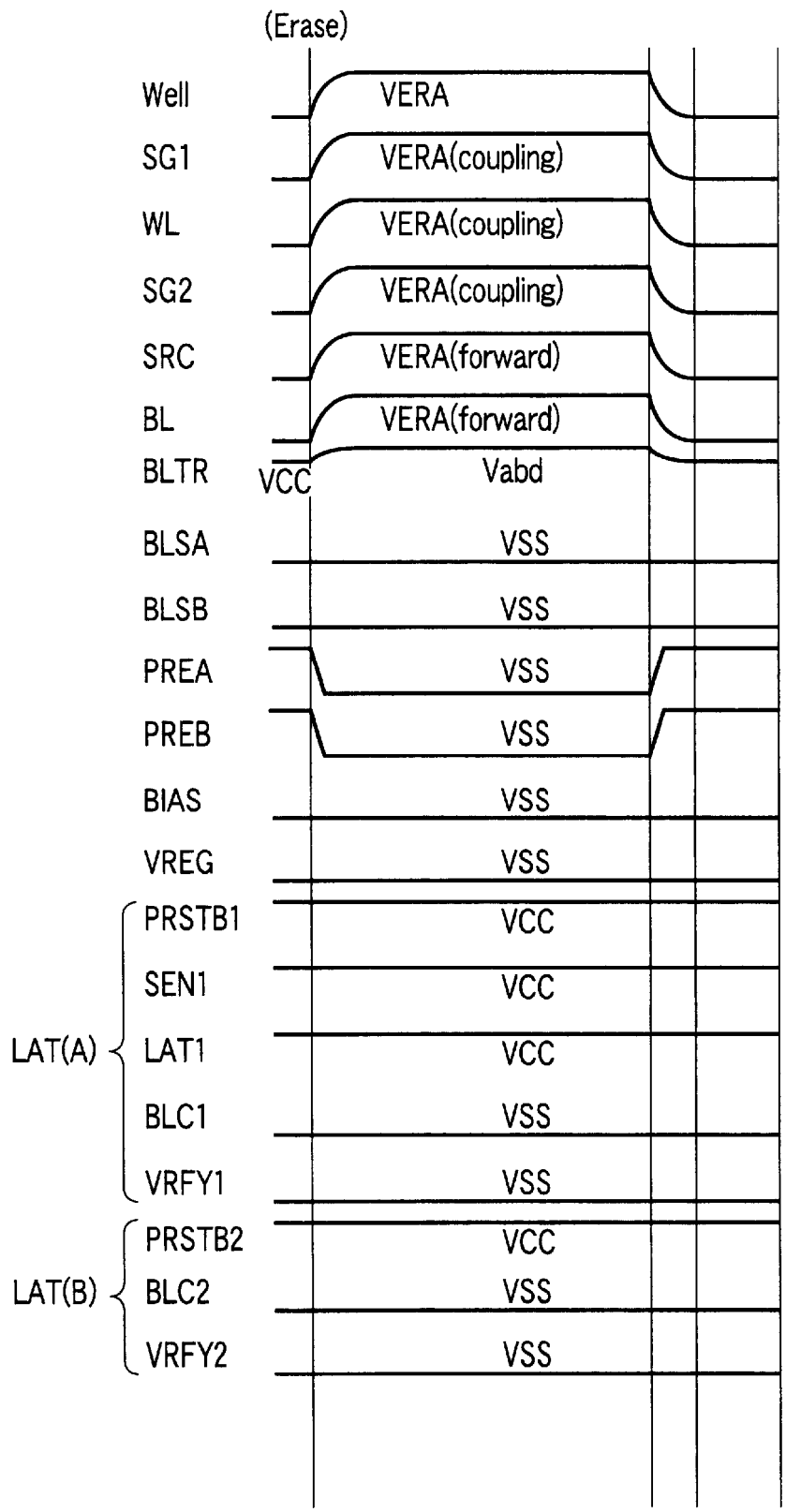
FIG. 39 is a waveform diagram showing the sequence for an erase operation.

FIG. 39 shows the sequence for an erase operation. When an erase operation has been carried out, the data in the memory cell goes to state "0." As a result, even when reading is done on either the first page or second page, data "1" is outputted.

(Erase Verify)

Figure 40:
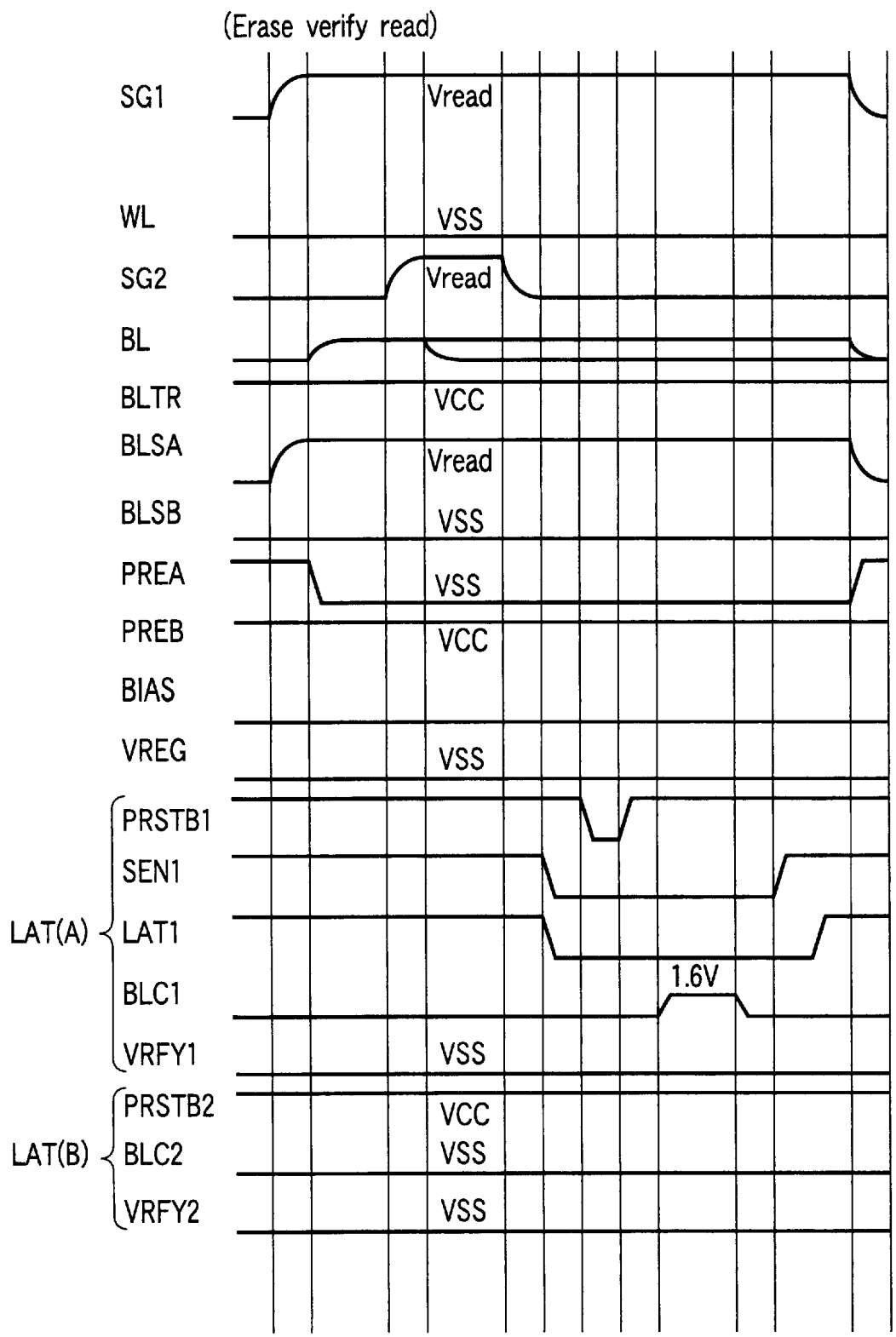
FIG. 40 is a waveform diagram showing the sequence for an erase verify operation.

FIG. 40 shows the sequence for an erase verify operation. In an erase verify operation, one (BLi) of the two bit lines (BLi, BL+1) connected to the data storage circuit is subjected to an erase verify read operation. To do this, all the word lines in the block are forced to VSS in the selected state. After the source line SRC of the cell is forced to VDD and the select line SG1 is forced to Vread, the select line SG2 on the source side of the cell is set at Vread. The potential of −Vth of the shallowest one of the 16 cells is outputted to the drain side of the cell, or the bit line.

Here, the first latch circuit LAT(A) is made high and the signal BLC1 is set at 1.6 V. In this state, when Vth is −0.6 V or less (sufficient erasure), the first latch circuit LAT(A) remains high. When Vth is −0.6 V or more (insufficient erasure), the data in the first latch circuit LAT(A) goes low. Therefore, when the data in all the first latch circuits goes high, the erase verify is considered to be OK.

(Step-Up Shift Test)

FIG. 41 shows a voltage setting circuit provided in the control voltage generating circuit 14 of FIG. 1. The control voltage generating circuit 14 include a step-up circuit as described earlier. The step-up circuit generates a program voltage Vpgm, an erase voltage Vera, a voltage Vpass, and others. The program voltage Vpgm is raised stepwise as describe earlier.

The characteristics of the memory cell vary with the change of the process and others. Each voltage generated by the step-up circuit also varies with the change of the process and others. Therefore, it is necessary to set the program voltage Vpgm, erase voltage Vera, and voltage Vpass according to the characteristics of the chip. For this reason, in a test before the replacement with the redundancy area, the autoprogram and autoerase are carried out. According to the result of this, the program start voltage is set and the erase start voltage is set.

The voltage setting circuit of FIG. 41 can set the optimum program voltage Vpgm, voltage Vpass, and erase voltage Vera according to the characteristics of the chip.

Specifically, the voltage setting circuit is composed of an initial data memory fuse 161 and a counter 162. In the initial data memory fuse 161, the initial data for controlling the voltage Vpgm, voltage Vpass, and voltage Vera is set using fuses. These fuses are programmed according to the result of the autoprogram and autoerase. The autoprogram and auto-erase are executed during the test before the replacement with the redundancy area. The initial data set in the fuses is preset in the counter 162 in generating the voltage Vpgm, voltage Vpass, and voltage Vera. The counter 162 is composed of, for example, a preset counter. Signals CT1, CT2 are supplied to the counter 162. The output signal of the counter 162 is connected to the limiter of, for example, the step-up circuit 163 and changes the limit value of the limiter.

The signal CT1 is supplied when, for example, one program or erase operation has been completed and the verify has failed (NG). The counter 162 is incremented by the signal CT1. According to the output signal from the counter 162, the limiter is so controlled that the step-up circuit 163 outputs one-step higher voltage.

The first embodiment is characterized by the signal CT2. Specifically, in the test mode, the program start voltage and erase start voltage whose data were read from the initial data memory fuse 161 are incremented by several steps.

Generally, in the acceleration test after the trimming, a slightly high program start voltage and erase start voltage were applied uniformly. Use of the signal CT2, however, realizes the function of making a change of plus or minus several steps for an acceleration test. Therefore, it is possible to apply a voltage suitable for each chip.

In an acceleration test when the program that makes the voltages Vpass and Vpgm lower than the data set in the initial data memory fuse 161 has not been selected, the counter 162 must be incremented in the minus direction. A counter capable of incrementing in the minus direction is complex. For this reason, the counter is incremented by (one round)—(several steps) using the signal CT2, thereby setting the voltage lower than the data set in the initial data memory fuse 161. With this configuration, a specified value can be set easily without using a complex counter.

In the first embodiment, the memory cell array 1 includes a plurality of blocks bk10 To bk123 and a plurality of block redundancies blkRD0 To blkRD9. Each of blocks bk10 To bk123 and block redundancies blkRD0 to blkRD9 is provided with a block select circuit 6a. Each block select circuit 6a has a fuse 109. By blowing the fuse 109, any of the block redundancies blkRD0 To blkRD9 can be set as a ROM block for storing security information. Therefore, security information can be set in the ROM block.

Moreover, it is possible to inhibit the ROM block from being written into or erased from, if necessary, by blowing the fuse 151d or 152d in the write inhibit circuit 15a or erase inhibit circuit 15b of the ROM block in the control circuit 15.

Furthermore, by blowing the fuse 109 of the block select circuit 6a corresponding to the faulty block, the faulty block can be made unselected reliably. As a result, during the program (or double-speed autoprogram) operation or erase (or double-speed autoerase) operation, it is possible to prevent the verify operation from being repeated up to the maximum number of times.

In addition, the first embodiment can determine whether to use ECC by using the fuse provided in, for example, the control section 15. Since 21 bits for ECC can be used as redundancies when ECC is not used, the faulty remedying efficiency can be improved.

When the autoprogram and autoerase are executed in the test process before the replacement with a redundancy, the presence of a faulty column would make the verify operation unsuccessful or NG. In the first embodiment, however, when the number of column redundancies is equal to or smaller than a specified value, the result of the verify operation is ignored. For this reason, in the test before the replacement with a redundancy, the autoprogram and autoerase can be executed, which makes it possible to set the program start voltage and erase start voltage.

Furthermore, signal CT2 is supplied to the counter 162. Use of signal CT2 realizes the function of increasing or decreasing the program start voltage and erase start voltage fixed in the initial data memory fuse 161 by several steps for an acceleration test. Therefore, the first embodiment has the advantage of being capable of applying a suitable voltage to each chip as compared with the case where a slightly high program start voltage and erase start voltage were applied uniformly in the prior art.

(Second Embodiment)

Hereinafter, a second embodiment of the present invention will be explained. In the first embodiment, one bit of data is written in a one-page write operation. In contrast, the second embodiment enables one bit to be written in a one-page write operation and two bits to be written consecutively in a two-page simultaneous write operation. This achieves a high-speed write operation in writing the data on consecutive pages simultaneously.

When the first page and second page are programmed independently in the first embodiment, one threshold value is written in the first page program and two threshold values are written in the second page program. In contrast, three threshold values are written in the first-page and second-page simultaneous program.

Figure 42:
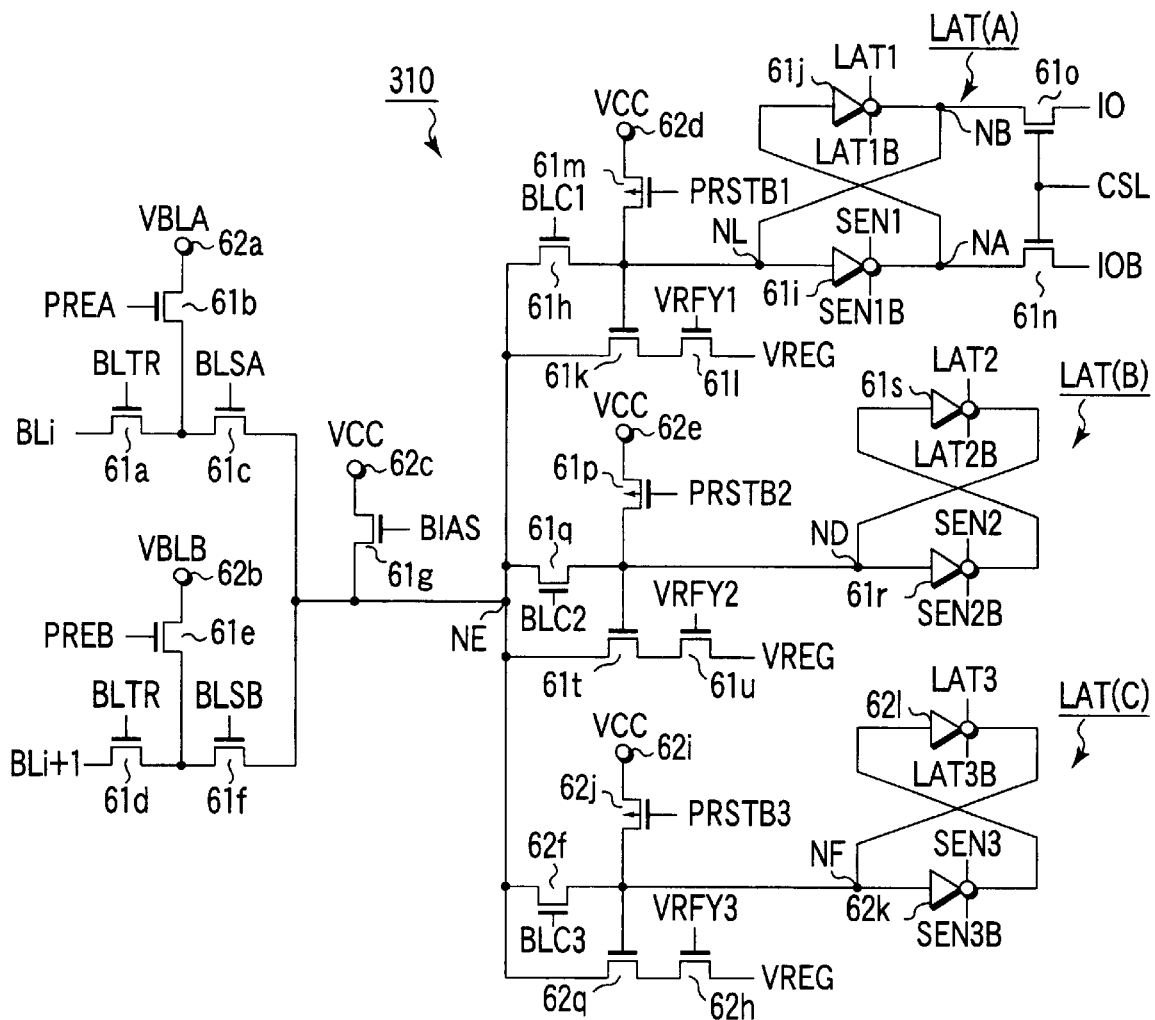
FIG. 42 is a circuit diagram of a data storage circuit according to a second embodiment of the present invention.

FIG. 42 shows the configuration of a data storage circuit applied to the second embodiment. To simplify the explanation, the data storage circuit is assumed to have three latch circuits. (Two latch circuits may be used to write three threshold values at the same time.)

In FIG. 42, the same parts as those in FIG. 5 are indicated by the same reference numerals and only what differs from the latter will be explained. The data storage circuit of FIG. 42 further includes a third latch circuit LAT(C). In the third latch circuit LAT(C), the node NE is connected to one end of the current path of a transistor 62f. Signal BLC3 is supplied to the gate of the transistor 62f. A terminal 62i is connected via a p-channel MOS transistor 62j to the other end of the current path of the transistor 62f. The voltage VCC is supplied to the terminal 61i. Signal PRSTB3 is supplied to the gate of the transistor 62j.

The third latch circuit LAT(C) is connected to the other end of the current path of the transistor 62f. The third latch circuit LAT(C) is composed of two clocked inverter circuits 62k, 62l. The clocked inverter circuit 62k is controlled by signals SEN3, SEN3B. The clocked inverter circuit 62l are controlled by signals LAT3, LAT3B. The third latch circuit LAT(C) latches the data read from a memory cell.

Transistors 62q, 62h are connected in series with the node NE. The gate of the transistor 62q is connected to the node NF of the third latch circuit LAT(C). Signal VRFY3 is supplied to the gate of the transistor 62h. Signal VREG is supplied to the current path of the transistor 62h. These transistors 62q, 62h set the potential on the bit line according to the data latched in the third latch circuit LAT(C).

With the above configuration, the operation will be explained.

(First-Page and Second-Page Simultaneous Program)

Figure 43:
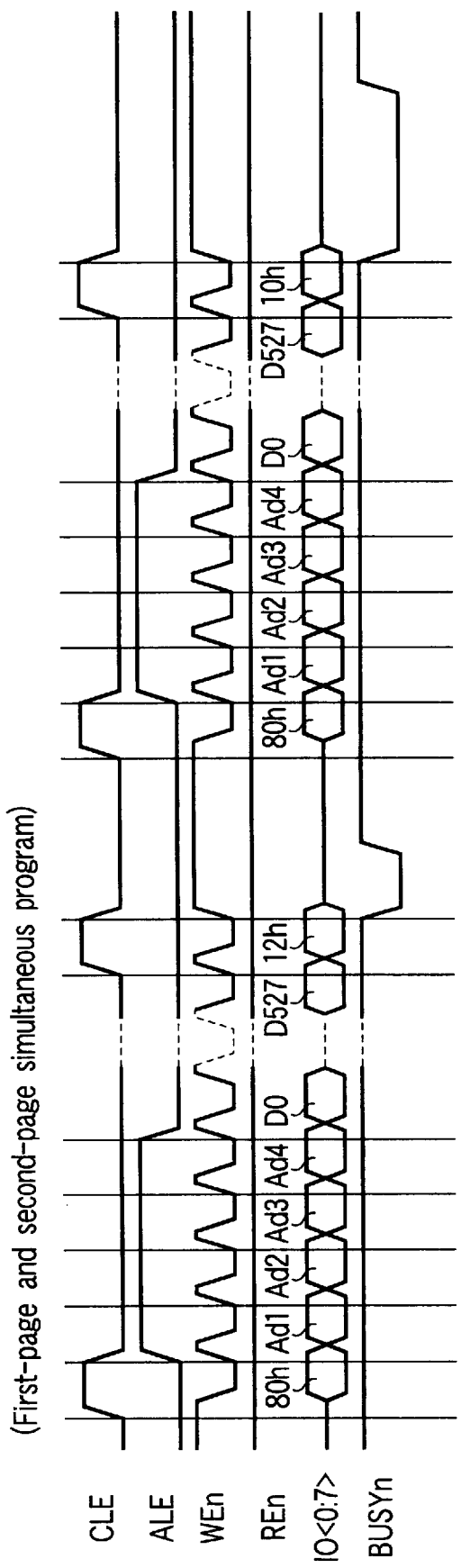
FIG. 43 is a waveform diagram showing the sequence for the operation of the first-page and second-page simultaneous program.

FIG. 43 shows the sequence for the operation of the first-page and second-page simultaneous program. FIGS. 44 and 45 are tables showing each section. FIG. 46 is a flowchart.

During the first-page and second-page simultaneous program, the data input command "80h" is first inputted and then the address and the data are inputted as described in FIG. 19. When the externally inputted data is data "1" indicating that no writing is to be done, the node NC of the first latch circuit LAT(A) in FIG. 42 goes high. When the externally inputted data is data "0" indicating that writing is to be done, the node NC goes low.

Next, as shown in FIG. 44, the data latched in the first latch circuit LAT(A) is moved to the second latch circuit LAT(B). To do this, the command "12h," which is as short as 1.5 µs, is inputted as in the double-speed program. At this time, the contents of the first latch circuit LAT(A) are transferred to the second latch circuit LAT(B). Thereafter, the command "80h," address, and data are inputted again. This time, the address is the page address next to the previously inputted address (differs only in A9). The data is latched in the first latch circuit LAT(A). Thereafter, when the autoprogram execute command "10h" is inputted, the autoprogram is started.

When it is verified whether the data in the memory cell is in state "1," the memory cells into which state "2" and state "3" are written are also considered to be OK. For this reason, these cells are forced to be NG. To do this, the second latch circuit LAT(B) corresponding to the memory cells into which state "2" and state "3" are written is caused to have data "1." When it is verified whether the data in the memory cell is in state "2," the memory cell into which state "3" is written is also considered to be OK. For this reason, to force the cell to be NG, the third latch circuit LAT(B) corresponding to the memory cell into which state "3" is written is caused to have data "1."

Specifically, when one or both of the data latched in the first latch circuit LAT(A) and second latch circuit LAT(B) are data "0" indicating that writing is to be done, the first latch circuit LAT(A) is brought into the writing state.

To achieve these operations, as shown in FIG. 45A, the data in the second latch circuit LAT(B) is replaced with the data in the third latch circuit LAT(C). As a result, writing into state "3" brings the second latch circuit LAT(B) into the high level. Writing into state "2" and state "3" brings the third latch circuit LAT(C) into the high level (ST41).

Thereafter, a program operation is carried out. In the program operation, the sequence of FIG. 23 is used in the same manner as in the program that deals with the first page and second page independently (ST42).

FIGS. 45B, 45C, and 45D are tables showing a verify operation.

In a verify operation that judges whether the data in the memory cell is in state "1" shown in FIG. 45B, the memory cells into which state "2" and state "3" are written are also judged to be OK. When state "2" and state "3" are written by the aforementioned operation, the third latch circuit LAT(C) is at the high level. For this reason, the bit line is forced to be low, indicating NG (ST43).

In a verify operation that judges whether the data in the memory cell is in state "2" shown in FIG. 45C, the memory cell into which state "3" is written is also judged to be OK. When state "3" is written by the aforementioned operation, the second latch circuit LAT(B) is at the high level. For this reason, the bit line is forced to be low, indicating NG (ST44).

In a verify operation that judges whether the data in the memory cell is in state "3" shown in FIG. 45D, the result is OK only when state "3" is written (ST45).

Therefore, when the first latch circuit LAT(A) is at the low level, the program operation and verify operation are repeated without performing the write operation again until the data in the first latch circuits LAT(A) in all of the data storage circuits goes high (ST48).

In the test process before the faulty block is replaced with a block redundancy, the number of low level data items latched in the first latch circuits LAT(A), or the number of verify files, is counted. When the count value is equal to or larger than a specified value (in the second embodiment, when there are four column redundancies, the specified value is four; and when there are eight column redundancies, the specified value is eight), the program verify is repeated again. When the count value is smaller than the specified value, the program operation is terminated (ST46, ST47).

(First-Page and Second-Page Double-Speed Simultaneous Program)

Figure 47:
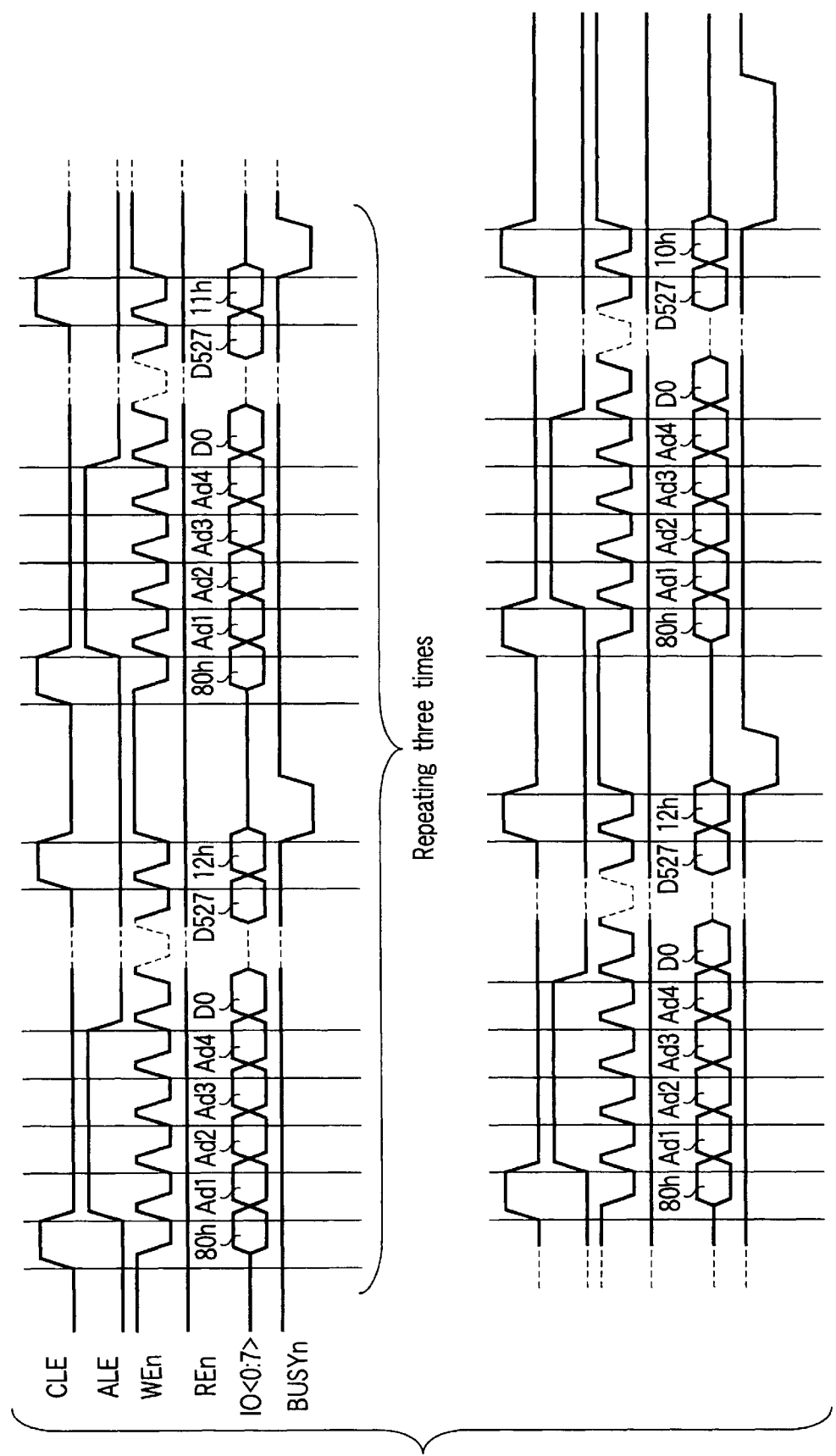
FIG. 47 is a waveform diagram showing the sequence for the operation of the first-page and second-page double-speed simultaneous program.

FIG. 47 shows the operation of a first-page and second-page double-speed simultaneous program. In this case, too, the command "80h," address, and data are inputted as described above. The data is latched in the first latch circuit LAT(A). Then, the command "12h" is inputted, thereby outputting signal BUSY. Thereafter, the data in the first latch circuit LAT(A) is transferred to the second latch circuit LAT(B). Then, the command "80h," address (the page address next to the previously inputted address), data, and command "11h" are inputted, thereby outputting signal BUSY. This operation is carried out four times, while the array address (A15, A16) is changed each time. In the last time, the autoprogram execute command "10h" is inputted in place of the command "11h," thereby starting the actual program.

With the second embodiment, the first page and second page are programmed at the same time, which shortens the programming time.

Furthermore, use of the double-speed program enables the programming time to be made much shorter.

While in the first and second embodiments, the block select circuit 6a has the fuse 109 and the write inhibit circuit 15a and erase inhibit circuit 15b have the fuses 151d and 152d respectively, the present invention is not limited to the fuses. For instance, nonvolatile memory, such as EEPROM cells, may be used. In addition, other types of fuses may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array with a first and a second storage area, said first storage area having a plurality of memory elements selected by an address signal and said second storage area having a plurality of memory elements selected by a control signal; and
a control circuit which has a fuse element and, when said fuse element has been blown, inhibits at least one of writing and erasing from being done on said second storage area.

2. The semiconductor memory device according to claim 1, further comprising a third storage area for replacing a faulty memory element in said first storage area.

3. The semiconductor memory device according to claim 2, wherein said control circuit controls said third storage area as said second storage area.

4. The semiconductor memory device according to claim 3, wherein said second storage area stores security information.

5. The semiconductor memory device according to claim 1, further comprising a select circuit which selects said second storage area and makes said second storage area unselected at the time of a simultaneous program and a simultaneous erasure.

6. A semiconductor memory device comprising:
a memory cell array with a first and a second storage area, said first storage area having a plurality of memory elements selected by an address signal and said second storage area having a plurality of memory elements selected by a control signal;
select circuits which are provided so as to correspond to said first and second storage areas and each of which has a fuse element and selects either said first or second storage area according to the address signal; and
a switch element which is connected in parallel with said fuse element and, when said fuse element has been blown, is caused to conduct according to the control signal and sets said select circuit selectable.

7. The semiconductor memory device according to claim 6, further comprising a third storage area for replacing a faulty memory element in said first storage area.

8. The semiconductor memory device according to claim 7, wherein a control circuit controls said third storage area as said second storage area.

9. The semiconductor memory device according to claim 8, wherein said second storage area stores security information.

10. The semiconductor memory device according to claim 6, further comprising a select circuit which selects said second storage area and makes said second storage area unselected at the time of a simultaneous program and a simultaneous erasure.

11. The semiconductor memory device according to claim 6, further comprising a sensing circuit for sensing the state of the fuse elements.

12. A semiconductor memory device comprising:
a plurality of blocks having a plurality of memory elements;
storage circuits which are provided so as to correspond to said blocks and store data of a first logic level or a second logic level;
a sensing circuit for sensing the storing state of said storage circuits; and
a read circuit which reads data from the memory elements of each of said blocks and which, when said sensing circuit has sensed that said storage circuit has stored said first logic level, outputs the data in the memory elements of said block, and, when said sensing circuit has sensed that said storage circuit has stored said second logic level, outputs a specific value, regardless of the data in the memory elements of said block.

13. The semiconductor memory device according to claim 12, wherein said storage circuits store data of said second logic level, when the corresponding ones of said blocks are faulty.

14. The semiconductor memory device according to claim 12, wherein said storage circuit is either a fuse element or an EEPROM cell.

15. A semiconductor memory device comprising:
a first storage area which has a plurality of memory elements and stores externally inputted data;
an error correction code generating circuit for generating an error correction code; and
a second storage area which stores the error correction code generated by said error correction code generating circuit according to said externally inputted data and, when said error correction code generating circuit is unactivated, is used to replace a faulty memory element in said first storage area.

16. The semiconductor memory device according to claim 15, further comprising a control section for setting said error correction code generating circuit to either activation or deactivation.

17. The semiconductor memory device according to claim 16, further comprising a data storage section which receives writing data and the error correction code supplied from said error correction code generating circuit and which is connected to the column lines of said first and second storage areas.

18. The semiconductor memory device according to claim 17, further comprising:
a column address register for receiving a column address signal; and
a column decoder which is connected to said column address register and said data storage section and decodes said column address signal supplied from said column address register and which, when said error correction code generating circuit is activated, selects more column lines than when said error correction code generating circuit is deactivated.

19. The semiconductor memory device according to claim 18, wherein said column decoder includes a column predecoder, which predecodes the column address signal when said error correction code generating circuit is activated, and stops the predecoding and outputs a signal for selecting column redundancy when said error correction code generating circuit is deactivated.

20. The semiconductor memory device according to claim 19, wherein said second storage area stores security information.

21. The semiconductor memory device according to claim 20, wherein a storage circuit stores at least either the program voltage of data or the initial value of an erasing voltage.

22. The semiconductor memory device according to claim 21, wherein a first signal increments either the program voltage or the initial value of the erasing voltage supplied to a counter in several steps.

23. The semiconductor memory device according to claim 22, further comprising a second signal supplied to said counter, when a first program or erase operation has been completed and the verify operation has resulted in NG.

* * * * *